(12) United States Patent
Kato

(10) Patent No.: US 6,999,650 B2
(45) Date of Patent: Feb. 14, 2006

(54) OPTICAL SWITCH

(75) Inventor: Yoshichika Kato, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 214 days.

(21) Appl. No.: 10/435,063

(22) Filed: May 9, 2003

(65) Prior Publication Data

US 2003/0210853 A1 Nov. 13, 2003

(30) Foreign Application Priority Data

May 10, 2002 (JP) .............................. 2002-135574

(51) Int. Cl.
*G02B 6/35* (2006.01)

(52) U.S. Cl. .......................................... 385/18; 385/17
(58) Field of Classification Search .................. 385/18
See application file for complete search history.

(56) References Cited

U.S. PATENT DOCUMENTS

2002/0141038 A1 * 10/2002 Mori .......................... 359/295
2004/0234191 A1 * 11/2004 Norimatsu .................... 385/18

FOREIGN PATENT DOCUMENTS

| EP | 1033601 | 9/2000 |
|----|---------|--------|
| EP | 1189092 A2 | 3/2002 |
| EP | 1245529 | 10/2002 |
| JP | 10256563 | 9/1998 |
| JP | 2001264650 | 9/2001 |
| JP | 200339392 | 2/2003 |
| WO | WO 03014799 | 11/1996 |

OTHER PUBLICATIONS

Hélin, P., et al.: "Self Aligned Vertical Mirrors and V-Grooves Applied to Self-Latching Matrix Switch for Optical Networks," Proc. of IEEE Conf. on Optical MEMs 2000, Aug. 21-24, 2000, Hawaii, IEEE 2000, pp. 467-472.

(Continued)

*Primary Examiner*—John R. Lee
*Assistant Examiner*—Phillip A Johnston
(74) *Attorney, Agent, or Firm*—David N. Lathrop, Esq.; Gallagher & Lathrop

(57) ABSTRACT

There is provided an optical switch configured such that the electrode-to-electrode distance can be easily set to a desired distance and a plurality of protrusions or an electrode pattern for preventing the sticking from occurring can easily be formed on the surface of a fixed electrode substrate on which a fixed electrode is formed. There is prepared an upper substrate comprising an insulation layer, a thick single crystal silicon layer formed on the top surface of the insulation layer, and a thin single crystal silicon layer formed on the bottom surface of the insulation layer. A movable plate-like electrode and a plurality of flexible beam-like members for supporting the movable plate-like electrode to be displaced vertically are formed in the thin single crystal silicon layer. By applying an etching to the thick single crystal silicon layer, a plurality of the optical fiber securing grooves are formed as well as a plurality of micro-mirrors erecting from the movable plate-like electrode are formed on the thick single crystal silicon layer. The upper substrate is mounted on a lower substrate comprising a fixed electrode substrate and a fixed electrode formed on the top surface thereof, through a spacer interposed therebetween, thereby to juxtapose the fixed electrode and the thin single crystal silicon layer substantially in parallel with each other and in opposed manner with a predetermined gap therebetween.

14 Claims, 12 Drawing Sheets

OTHER PUBLICATIONS

Hélin, P., et al.: "Self Aligned Vertical Mirrors and V-Grooves Applied to a Self-Latching Matrix Switch for Optical Networks," Proc. 13th IEEE Int'l. Micro Electro Mech. Syst. Conf. (MEMS-2000) Jan. 23-27, 2000, Miyazaki, Japan, pp. 467-472.

Toshiyoshi, Hiroshi, Basis of an Electrostatically Operated Microactuator, No. 1, http://toshi.fujita3.iis.u-tokyo.ac.jp/onlinelecture/electrostatic1.pdf (the title was translated into English from the original Japanese).

* cited by examiner

OPTICAL SWITCH

BACKGROUND OF THE INVENTION

1. Field of the Invention

The present invention relates to an optical switch that is manufactured by use of micromachining technology and used in changing the optical path of an optical signal, and more particularly, to an optical switch configured such that the electrode-to-electrode distance between a movable plate-like electrode and a fixed or stationary electrode of the optical switch can be easily set to a desired distance.

2. Description of the Related Art

Optical switches of various types that are manufactured by use of micromachining technology have been heretofore provided. For example, an example of the prior art 2×2 optical switch will be described with reference to FIGS. 1 and 2. In the specification, the 2×2 optical switch is defined such that it has two input side optical fibers mounted thereto each emitting an optical signal therefrom and two output side optical fibers mounted thereto each receiving an optical signal incident thereon and that is capable of concurrently switching the optical paths of optical signals emitted respectively from the two output side optical fibers so that each optical signal is incident on corresponding one of the two input side optical fibers.

FIG. 1 is a plan view illustrating a construction of the prior art 2×2 optical switch, and FIG. 2 is a generally sectional view taken along the line 2—2 in FIG. 1 and looking in the direction indicated by the arrows. The illustrated optical switch SW1 comprises: a movable electrode supporting plate 14 of a generally rectangle in plan; an opening 13 of a generally square in plan formed in the movable electrode supporting plate 14 at generally the central portion thereof; four V-shaped grooves 25A, 26A and 25B, 26B, two grooves 25A and 26A of which are formed on the top surface of the movable electrode supporting plate 14 in the longitudinal direction thereof at one side of the opening 13 and the remaining two grooves 25B and 26B of which are formed on the top surface of the movable electrode supporting plate 14 in the longitudinal direction thereof at the opposite side of the opening 13; a fixed or stationary electrode substrate 19 of a generally rectangle in plan and of a substantially the same shape and size as those of the movable electrode supporting plate 14, the fixed electrode substrate 19 being disposed underneath the movable electrode supporting plate 14 and having its elevated portion 18 on the center thereof to be fitted into the opening 13 of the movable electrode supporting plate 14; a movable plate-like electrode 11 of a generally square in plan that is disposed substantially in parallel with the elevated portion 18 of the fixed electrode substrate 19 with a predetermined space or gap between them and above the opening 13 of the movable electrode supporting plate 14; four flexible beams 12A1, 12A2, 12B1, and 12B2 for supporting the movable plate-like electrode 11 to be movable toward and away from the elevated portion 18 of the fixed electrode substrate 19; and four thin plate-like or sheet-like micro-mirrors 17A1, 17A2, 17B1, and 17B2 upstanding from the top surface of the movable plate-like electrode 11.

Each of the four flexible beams 12A1, 12A2, 12B1, and 12B2 is called "flexure" in this technical field, and the base of each of the two beams 12A1 and 12A2 is integrally connected to corresponding one of the two opposed ends of one anchor portion 15A of a generally rectangle in plan in the longitudinal direction thereof, the anchor portion 15A being opposed to the other anchor portion 15B of a generally rectangle in plan. The base of each of the remaining two beams 12B1 and 12B2 thereof is integrally connected to corresponding one of the two opposed ends of the other anchor portion 15B of a generally rectangle in plan in the longitudinal direction thereof. Each of the four beams 12A1, 12A2 and 12B1, 12B2 extends from corresponding one of the two opposed ends of each of the anchor portions 15A and 15B along corresponding one of the four sides of the movable plate-like electrode 11, and each of the four ends thereof is integrally connected to corresponding one of the four corners of the movable plate-like electrode 11. The paired anchor portions 15A and 15B are fixed to the movable electrode supporting plate 14 at the both sides of the opening 13 in the longitudinal direction of the movable electrode supporting plate 14.

Each of the four V-shaped grooves 25A, 26A and 25B, 26B extends from a predetermined position outside the pair of anchor portions 15A and 15B (a predetermined position toward the ends of the movable electrode supporting plate 14 in the longitudinal direction thereof) to corresponding one of the ends of the movable electrode supporting plate 14 in the longitudinal direction thereof, and the two V-shaped grooves 25A and 26A and the two V-shaped grooves 25B and 26B opposed to one another through the opening 13 put therebetween in the longitudinal direction of the movable electrode supporting plate 14 are aligned with one another.

The four thin plate-like micro-mirrors 17A1, 17A2, 17B1 and 17B2 have substantially the same shape and size with one another, and the two micro-mirrors 17A1 and 17B1 are disposed on a first straight line that passes through substantially the center of the movable plate-like electrode 11 and forms an angle of 45° with a horizontal line. The remaining two micro-mirrors 17A2 and 17B2 are disposed on a second straight line that passes through substantially the center of the movable plate-like electrode 11 and is orthogonal to the first straight line. These micro-mirrors 17A1, 17A2, 17B1 and 17B2 are disposed at such positions that they are away by substantially the same distance in the radial direction from the intersection between the first and second straight lines and that axial lines of corresponding two V-shaped grooves 25A and 26B and of corresponding two V-shaped grooves 26A and 25B pass through substantially the centers of the micro-mirrors.

The micro-mirrors 17A1, 17A2, 17B1, 17B2 may be fabricated, for example, by applying a photoresist film of a predetermined thickness on the top surface of the movable plate-like electrode 11, exposing only portions of the photoresist film on which the micro-mirrors are to be formed, thereafter removing the photoresist film except for the exposed portions thereof by use of a solvent to form four micro-mirror bodies, and coating mirror surfaces of these micro-mirror bodies with a metal such as gold (Au) or the like.

Alternatively, as described in Japanese Patent Application No. 243582/2001 (or PCT Application PCT/JP02/08177 filed on Aug. 9, 2002 claiming a priority of Japanese Patent Application No. 243582/2001) filed on Aug. 10, 2001 by the same assignee as that of the present application, micro-mirrors erecting from a silicon substrate may be fabricated by applying an orientation-dependent wet etching or chemical anisotropic wet etching to the silicon substrate the surface of which is (100) crystal face. In such case, since the mirror surface of each micro-mirror becomes (100) crystal face, the accuracy in verticality and flatness of each micro-mirror comes to much high, and hence optical loss can be minimized. Further, the details thereof will be referred to the above Japanese Patent Application No. 243582/2001 (or PCT/JP02/08177), or a paper entitled "SELF ALIGNED VERTICAL MIRRORS AND V-GROOVES APPLIED TO A SELF-LATCHING MATRIX SWITCH FOR OPTICAL NETWORKS" published by Philippe Helin, et al. in Thirteenth IEEE International Micro Electro Mechanical Systems Conference (MEMS-2000) held on Jan. 23 through 27, 2000 at Miyazaki, Japan.

Optical fibers are located and mounted in the four V-shaped grooves 25A, 26A and 25B, 26B, respectively. In this example, an output side optical fiber 31A and an input side optical fiber 32A are located and mounted in the V-shaped grooves 25A and 26A positioned in the left side in FIG. 1, respectively, and in the V-shaped grooves 25B and 26B positioned in the right side in FIG. 1 are located and mounted an output side optical fiber 31B and an input side optical fiber 32B, respectively. As a result, the output side optical fiber 31A mounted in the V-shaped groove 25A and the input side optical fiber 32A mounted in the V-shaped groove 26B are opposed to and aligned to each other (are disposed on the same optical axis line), and the input side optical fiber 32A mounted in the V-shaped groove 26A and the output side optical fiber 31B mounted in the V-shaped grooves 25B are opposed to and aligned to each other (are disposed on the same optical axis line).

The movable electrode supporting plate 14, four beams 12A1, 12A2, 12B1 and 12B2, the pair of anchor portions 15A and 15B, and movable plate-like electrode 11 can be formed into one body. For example, a substrate made of single crystal silicon of a predetermined thickness is used as the movable electrode supporting plate 14, and an insulation layer, for example, silicon dioxide ($SiO_2$) layer 21 is formed on the top surface of the single crystal silicon substrate 14, and on the top surface of the silicon dioxide layer 21 is formed, for example, a single crystal silicon layer. The single crystal silicon layer is processed using photolithography technology to form the above-mentioned four beams 12A1, 12A2, 12B1 and 12B2, the pair of anchor portions 15A and 15B, and movable plate-like electrode 11 therefrom. Thereafter, the single crystal silicon substrate 14 is etched from the bottom surface side thereof to form the opening 13 of a generally square therein. Thus, the four beams 12A1, 12A2, 12B1 and 12B2, the pair of anchor portions 15A and 15B, and movable plate-like electrode 11 are formed into one body as well as the pair of anchor portions 15A and 15B is integrally fixed to the top surface of the movable electrode supporting plate 14. Further, in FIG. 2, a reference numeral 22 denotes an insulation layer (for example, silicon dioxide layer) that is previously formed on the bottom surface of the movable electrode supporting plate 14. This insulation layer 22 is used as a mask in forming the opening 13 in the movable electrode supporting plate 14 by use of photolithography technology.

In general, an SOI (Silicon on Insulator) substrate of a generally rectangle in plan will be used to form the movable electrode supporting plate 14, four beams 12A1, 12A2, 12B1 and 12B2, the pair of anchor portions 15A and 15B, and movable plate-like electrode 11 that are united with one another by use of photolithography technology. Since such manufacturing method for an optical switch is well known, it will be described in brief, here. Further, a 2×2 optical switch having the same construction as that of the above-mentioned 2×2 optical switch has been described in, for example, Japanese Patent Application Public Disclosure No. 82292/2002 (Japanese Patent Application No. 270621/2000), and therefore, the details thereof including the manufacturing method will be referred to this Japanese Patent Application Public Disclosure No. 82292/2002 (P2002-82292A).

First, an SOI substrate of a generally rectangle in plan is prepared. Generally, the SOI substrate is constituted by three layers that are a thick support substrate made of single crystal silicon, an insulation layer on the top of the thick support substrate, and a thin layer of single crystal silicon on the top of the insulation layer. In this example, there is used an SOI substrate comprising a thick support substrate (not shown in FIGS. 1 and 2) of single crystal silicon of a generally rectangle in plan, an insulation layer 21 of silicon dioxide formed on the top surface of the support substrate, and a thin layer (not shown in FIGS. 1 and 2) of single crystal silicon joined onto the top surface of the silicon dioxide layer 21. However, it goes without saying that any SOI substrate manufactured by use of one of known other methods or processes may be used. Further, in this example, the insulation layer (for example, silicon dioxide layer) 22 is previously formed on the bottom surface of the SOI substrate.

Next, by use of photolithography technology, a patterning of the thin single crystal silicon layer of the SOI substrate is done to leave portions thereof corresponding to shapes of the four beams 12A1, 12A2, 12B1 and 12B2, the pair of anchor portions 15A and 15B, and movable plate-like electrode 11 so that the thin single crystal silicon layer is removed except for the portions thereof corresponding to shapes of the four beams, the pair of anchor portions, and movable plate-like electrode. Thereafter, a portion of the silicon dioxide layer 22 on the bottom surface of the SOI substrate, which corresponds to the opening 13 of the movable electrode supporting plate 14, is removed. Thus, the four beams 12A1, 12A2, 12B1 and 12B2, the pair of anchor portions 15A and 15B, and movable plate-like electrode 11 are formed into one body from the thin single crystal silicon layer on the silicon dioxide layer 21 of the SOI substrate.

Next, the support substrate of single crystal silicon is etched from the bottom surface side of the SOI substrate using KOH solution to form the opening 13. As a result, the movable electrode supporting plate 14 of a generally rectangle in plan is formed from the support substrate of single crystal silicon of a generally rectangle in plan.

Further, it is needless to say that the opening 13 of a generally square formed in the movable electrode supporting plate 14 has such a size that it can accommodate the movable plate-like electrode 11 and four beams 12A1, 12A2, 12B1 and 12B2 therein.

The fixed electrode substrate 19 is a substrate made of, for example, single crystal silicon of a generally rectangle in plan, and at the central portion of the top surface thereof is formed the above-mentioned elevated portion 18 having substantially the same shape (in this example, generally square) and size as those of the opening 13 formed through the movable electrode supporting plate 14. The movable electrode supporting plate 14 constructed as discussed above is put on the fixed electrode substrate 19, and then, they are united by using, for example, a suitable adhesive or bonding agent. When the movable electrode supporting plate 14 is put on the fixed electrode substrate 19, the elevated portion 18 of the fixed electrode substrate 19, which serves as a fixed electrode fits into the opening 13 of the movable electrode supporting plate 14 from the bottom side thereof so that the elevated portion 18 of the fixed electrode substrate 19 and the movable plate-like electrode 11 are mounted in opposed state to each other with a predetermined space or gap therebetween. In such manner, the optical switch SW1 shown in FIGS. 1 and 2 is constructed. Further, in FIG. 2, a reference numeral 28 denotes an insulation layer (silicon dioxide layer) that is used as a mask in forming the elevated portion 18 on the fixed electrode substrate 19. This insulation layer 28 prevents the movable plate-like electrode 11 from being electrically connected to the elevated portion 18 of the fixed electrode substrate 19 when the movable plate-like electrode 11 is driven toward the elevated portion 18 and comes into contact with the top surface of the elevated portion 18.

According to the optical switch SW1 constructed as discussed above, the movable plate-like electrode 11 is allowed to move into the opening 13, and if a predetermined drive voltage is applied between the fixed electrode substrate 19 and the movable plate-like electrode 11 to produce an electrostatic attraction therebetween in such direction that the movable plate-like electrode 11 and the fixed electrode substrate 19 are attracted to each other, the movable plate-like electrode 11 is downwardly displaced, and hence the micro-mirrors 17A1, 17A2, 17B1 and 17B2 formed on and upstanding from the top surface of the movable plate-like electrode 11 are also displaced downwardly to a position where the micro-mirrors are out of the optical paths through each of which an optical signal (beam) will propagate.

Specifically explaining, in case any drive voltage is not applied between the fixed electrode substrate 19 and the movable plate-like electrode 11 so that the movable plate-like electrode 11 is not displaced and hence the micro-mirrors on the top surface of the movable plate-like electrode 11 exist on the optical paths through which optical signals (beams) emitted respectively from the output side optical fibers 31A and 31B will propagate, the optical signal (beam) emitted from the output side optical fiber 31A is reflected by the micro-mirror 17A1 existing on the optical path for that optical signal in the direction of forming an angle of 90° (forming a right angle) with the incident beam, and is incident on the micro-mirror 17A2. The incident optical signal is further reflected by the micro-mirror 17A2 in the direction of forming an angle of 90°, and is incident on the input side optical fiber 32A. Likewise, the optical signal (beam) emitted from the output side optical fiber 31B is reflected by the micro-mirror 17B1 existing on the optical path for that optical signal in the direction of forming a right angle with the incident beam, and is incident on the micro-mirror 17B2. The incident optical signal is further reflected by the micro-mirror 17B2 in the direction of forming an angle of 90°, and is incident on the input side optical fiber 32B.

On the contrary, in case a predetermined drive voltage is applied between the fixed electrode substrate 19 and the movable plate-like electrode 11 so that the movable plate-like electrode 11 is electrostatically driven toward the fixed electrode substrate 19 and hence the micro-mirrors on the top surface of the movable plate-like electrode 11 are moved downwardly so that they do not exist on (they are out of) the optical paths through which optical signals (beams) emitted respectively from the output side optical fibers 31A and 31B will propagate, the optical signal emitted from the output side optical fiber 31A goes right on without being reflected by the micro-mirrors 17A1 and 17B2, and is incident on the input side optical fiber 32B that is opposed to the output side optical fiber 31A. Likewise, the optical signal emitted from the output side optical fiber 31B goes right on without being reflected by the micro-mirrors 17B1 and 17A2, and is incident on the input side optical fiber 32A that is opposed to the output side optical fiber 31B. Thus, the optical path for the optical signal emitted from the output side optical fiber 31A can be switched from the input side optical fiber 32A to the input side optical fiber 32B, and similarly, the optical path for the optical signal emitted from the output side optical fiber 31B can be switched from the input side optical fiber 32B to the input side optical fiber 32A. In other words, the optical switch SW1 constructed as described above is capable of switching in space the optical path of an optical signal propagating through an optical waveguide or optical transmission line (path) without any intervention of a solid state optical waveguide.

In an optical switch of this type, in general, it is desirable in circuit design to make it possible that the movable plate-like electrode 11 is driven toward the stationary electrode substrate 19 by application of a drive voltage as low as possible. In other words, it is desirable in circuit design to reduce the absolute value of a drive voltage for driving the movable plate-like electrode 11 toward the stationary electrode substrate 19 to a value as small as possible. For such reason, in the prior art optical switch SW1 constructed as discussed above, the movable plate-like electrode 11, the four beams 12A1, 12A2, 12B1, 12B2, and the anchor portions 15A, 15B are formed into one body, and yet, the thickness of the movable plate-like electrode 11 and the four beams 12A1, 12A2, 12B1, 12B2 is made thin to lighten the weight thereof and to lessen the elastic forces of the four beams. However, the four beams must have their elastic forces for holding the movable plate-like electrode 11 substantially in parallel with the fixed electrode substrate 19 and for returning the movable plate-like electrode 11 already attracted to the fixed electrode substrate 19 to its original position therefrom. Therefore, there is a limit in reducing the magnitude of the drive voltage that is required to drive the movable plate-like electrode 11 by the predetermined distance toward the fixed electrode substrate 19.

In addition, in the above-constructed optical switch SW1, there is proposed another method for reducing the absolute value of a drive voltage in which the electrode-to-electrode distance (gap) between the movable plate-like electrode 11 and the fixed electrode substrate 19 is set to a necessary and minimum length. In such case, the thickness of the movable electrode supporting plate 14 (in case of using an SOI substrate, the support substrate of single crystal silicon) cannot be made thin too much in view of manufacturing process, and accordingly, there is adopted a procedure that the electrode-to-electrode distance between the movable plate-like electrode 11 and the fixed electrode substrate 19 is set to a necessary and minimum distance by providing the elevated portion 18 on the surface of the fixed electrode substrate 19 as shown in FIG. 2.

In this manner, in case the electrode-to-electrode distance is set to a necessary and minimum distance, the movable plate-like electrode 11 is electrostatically driven toward the fixed electrode substrate 19 until it comes into contact with the top surface of the elevated portion 18.

The relationship between the drive voltage to be applied to the movable plate-like electrode 11 and the distance that the movable plate-like electrode 11 is to be driven is not linear. It is characterized in that when the drive voltage applied to the movable plate-like electrode 11 is gradually increased, the movable plate-like electrode 11 is driven downwardly toward the fixed electrode substrate 19, and that when the driven distance of the movable plate-like electrode 11 becomes equal to or more than ⅓ of the electrode-to-electrode distance X between the bottom surface of the movable plate-like electrode 11 and the top surface of the elevated portion 18 of the fixed electrode substrate 19, the movable plate-like electrode 11 is driven at a dash toward the fixed electrode substrate 19 and is attracted or stuck to the top surface of the fixed electrode substrate 19 (in practice, the top surface of the elevated portion 18). A drive voltage by which the movable plate-like electrode 11 is driven at a dash toward the fixed electrode substrate 19 is called "pull-in voltage" in this technical field. Further, the details of the pull-in voltage will be referred to Japanese Patent Application Nos. 75443/2002 (P2002-75443) and 75817/2002 (P2002-75817) both of which were filed on Mar. 19, 2002, by the same assignee as that of the present application, or the homepage of Professor Hiroshi TOSHIYOSHI, Institute of Industrial Science, University of Tokyo:
http://toshi.fujita3.iis.u-tokyo.ac.jp/onlinelecture/electrostatic1.pdf In the prior art, since the movable plate-like electrode 11 is driven until it comes into contact with the top surface of the elevated portion 18 of the fixed electrode substrate 19 (by the distance X), the drive voltage is necessarily set to a voltage equal to or higher than the pull-in voltage. For this reason, when the movable plate-like electrode 11 moves over the distance equal to ⅓ of the electrode-to-electrode distance X, it is driven at a dash toward the fixed electrode substrate 19 thereby to come into contact with the top surface of the elevated portion 18 of the fixed electrode substrate 19.

When the movable plate-like electrode 11 is displaced downwardly and the bottom surface thereof comes into contact with the top surface of the elevated portion 18 of the fixed electrode substrate 19, a phenomenon occurs that van der Waals' force acts or affects between the bottom surface of the movable plate-like electrode 11 and the top surface of the elevated portion 18 of the fixed electrode substrate 19 so that they are attracted to each other, and that the movable plate-like electrode 11 is not restored to its original position in an instant even the application of the drive voltage is stopped. That is, there occurs a phenomenon that the movable plate-like electrode 11 and the elevated portion 18 of the fixed electrode substrate 19 are temporarily or permanently attracted or stuck to each other by van der Waals' force. This phenomenon is called "sticking" in this technical field. Consequently, it is impossible to switch the path of an optical signal at once, and hence there is a disadvantage that the reliability of switching operation is greatly deteriorated.

In view of the foregoing, there is proposed an optical switch that is constructed such that minute protrusions are formed on either one of the bottom surface of the movable plate-like electrode 11 opposed to the fixed electrode substrate 19 or the top surface of the fixed electrode substrate 19 opposed to the movable plate-like electrode 11 to reduce the contact area between the movable plate-like electrode 11 and the fixed electrode substrate 19, or a second fixed electrode pattern for preventing the sticking from occurring is formed on the top surface of the fixed electrode substrate 19, thereby to prevent occurrence of the phenomenon that the movable plate-like electrode 11 and the fixed electrode substrate 19 are temporarily or permanently attracted to each other by van der Waals' force. Such optical switch is disclosed in, for example, Japanese Patent Application Public Disclosure No. 256563/1998, Japanese Patent Application Public Disclosure No. 264650/2001 (P2001-264650A), or Japanese Patent Application Public Disclosure No. 39392/2003 (P2003-39392A).

There is shown in FIG. 3 an example of the prior art optical switch in which a plurality of minute protrusions are formed on the top surface of the elevated portion 18 of the fixed electrode substrate 19 to reduce the contact area between the movable plate-like electrode 11 and the elevated portion 18 of the fixed electrode substrate 19. FIG. 3 is a sectional view similar to FIG. 2, and the optical switch SW2 shown in FIG. 3 may have the same construction, structure and shape as those of the prior art optical switch SW1 already discussed with reference to FIGS. 1 and 2 except that a plurality of minute protrusions 23 are formed, for example, in a matrix manner on the top surface of the elevated portion 18 of the fixed electrode substrate 19. Therefore, in FIG. 3, portions and elements corresponding to those shown in FIGS. 1 and 2 will be denoted by the same reference characters attached thereto and explanation thereof will be omitted unless necessary.

In case a plurality of minute or very small protrusions 23 are formed, for example, in a matrix manner on the top surface of the elevated portion 18 of the fixed electrode substrate 19, when the movable plate-like electrode 11 is electrostatically driven downwardly and comes into contact with the top surface of the elevated portion 18 of the fixed electrode substrate 19, the bottom surface of the movable plate-like electrode 11 comes into contact with the pointed ends of these protrusions 23, and hence the movable plate-like electrode 11 is not in surface contact with the elevated portion 18 of the fixed electrode substrate 19. Accordingly, it is possible to greatly decrease the contact area between them and to prevent the sticking from occurring.

However, in order to prevent the movable plate-like electrode 11 from being electrically connected to the elevated portion 18 of the fixed electrode substrate 19 when the movable plate-like electrode 11 is driven toward the fixed electrode substrate 19 and comes into contact with the elevated portion 18 thereof, the protrusions 23 must be made of an insulation material or the surfaces of the protrusions 23 must be covered or coated with an insulation material. In case of forming the plural protrusions 23 on the top surface of the elevated portion 18 of the fixed electrode substrate 19, in general, a photoresist is applied on the top surface of the oxide film (oxide film, usually, silicon dioxide layer, used as a mask when the elevated portion 18 is formed) on the elevated portion 18, and the oxide film is patterned in a pattern corresponding to the protrusions 23, and then, the elevated portion 18 is etched using the patterned oxide film as a mask. Thus, the plural protrusions 23 are formed on the top surface of the elevated portion 18. For example, in case a plurality of the fixed electrode substrates 19 each having such elevated portion 18 formed thereon are arranged on a wafer or chip, even if a photoresist is dropped on the top surface of each of the elevated portions 18 and is coated thereon by spinning the wafer, it is impossible to spread the photoresist on the top surface of each elevated portion 18 with uniform thickness and satisfaction. Accordingly, there is a drawback that it is much difficult to form the protrusions 23 with high precision that have been accurately located at desired positions and have uniform height. In other words, in case the fixed electrode substrate 19 has its elevated portion 18 formed on the top surface thereof, it is much difficult to form on the top surface of the elevated portion 18 a plurality of the very small protrusions 23 with high precision that have been accurately located at desired positions and have uniform height. Further, in FIG. 3, a reference character 29 denotes an insulation layer (oxide film) formed on the top surface of the elevated portion 18. In addition, the details of a method of manufacturing a plurality of protrusions will be referred to the above-mentioned Japanese Patent Application Public Disclosure No. 256563/1998, Japanese Patent Application Public Disclosure No. 264650/

2001 (P2001-264650A), or Japanese Patent Application Public Disclosure No. 39392/2003 (P2003-39392A).

SUMMARY OF THE INVENTION

It is an object of the present invention to provide an optical switch that is configured such that the electrode-to-electrode distance between the movable plate-like electrode and the fixed electrode of the optical switch can be easily set to a desired distance.

It is another object of the present invention to provide an optical switch in which a plurality of protrusions or an electrode pattern for preventing the sticking from occurring can easily be formed on the surface of the fixed electrode substrate of the optical switch with high accuracy.

In order to accomplish the above objects, in an aspect of the present invention, there is provided an optical switch manufactured by use of micromachining technology, which comprises: a first substrate comprising: a fixed electrode substrate; and a fixed electrode that is formed on the top surface of the fixed electrode substrate; a second substrate comprising: a thick single crystal silicon layer; a thin single crystal silicon layer; and an insulation layer that is interposed between the bottom surface of the thick single crystal silicon layer and the top surface of the thin single crystal silicon layer; a spacer that is interposed between the top surface of the first substrate on which the fixed electrode is formed and the thin single crystal silicon layer of the second substrate, and for juxtaposing the fixed electrode of the first substrate and the thin single crystal silicon layer of the second substrate substantially in parallel with each other with a predetermined gap therebetween; a movable plate-like electrode that is formed in the thin single crystal silicon layer of the second substrate; a plurality of flexible beam-like members for supporting the movable plate-like electrode to be movable toward and away from the fixed electrode, the flexible beam-like members being formed in the thin single crystal silicon layer of the second substrate integrally with the movable plate-like electrode; a plurality of optical fiber securing grooves that are formed on the thick single crystal silicon layer of the second substrate by applying an etching to the thick single crystal silicon layer; a plurality of micro-mirrors that are formed in a portion of the thick single crystal silicon layer of the second substrate positioned above the movable plate-like electrode by applying an etching to the thick single crystal silicon layer, the micro-mirrors standing erect from the top surface of the movable plate-like electrode through the insulation layer and being located on the extensions of the optical fiber securing grooves; and a through hole that is formed in the spacer and enables the movable plate-like electrode to approach the fixed electrode, and wherein the optical switch is constructed such that an optical path for an optical beam incident thereon is changed by electrostatically driving the movable plate-like electrode toward the fixed electrode thereby to displace the micro-mirrors standing erect from the movable plate-like electrode.

In a first preferred embodiment, a plurality of the micro-mirrors is four each of which has a thin plate-like shape and one mirror surface, and the four micro-mirrors are formed on the top surface of the movable plate-like electrode through the insulation layer by applying an chemical anisotropic etching to the thick single crystal silicon layer in such manner that the mirror surfaces of the micro-mirrors form at an angle of 45° with the corresponding optical fiber securing grooves and that adjacent two mirror surfaces form at right angles with each other. A plurality of the optical fiber securing grooves is four, and the four optical fiber securing grooves are formed on the thick single crystal silicon layer by applying the chemical anisotropic etching to the thick single crystal silicon layer in such manner that two grooves are formed substantially in parallel with each other at one side of the micro-mirrors and the remaining two grooves are formed substantially in parallel with each other at the other side of the micro-mirrors in the longitudinal direction of the thick single crystal silicon layer, the two grooves at the one side and the two grooves at the other side being aligned with one another, and the groove surface of each optical fiber securing groove having a generally V-shape.

The four micro-mirrors as well as the four optical fiber securing grooves may be formed by applying a dry etching to the thick single crystal silicon layer. In such case, the groove surface of each optical fiber securing groove has a generally square shape.

Alternatively, the four micro-mirrors may be formed by applying a dry etching to the thick single crystal silicon layer, and the four optical fiber securing grooves may be formed by applying the chemical anisotropic etching to the thick single crystal silicon layer.

Alternatively, two micro-mirrors each of which has two wall surfaces forming at right angles with each other and are used as mirror surfaces respectively, may be formed in opposed manner on the top surface of the movable plate-like electrode through the insulation layer by applying a dry etching to the thick single crystal silicon layer in such manner that the mirror surfaces of each micro-mirror form at an angle of 45° with the corresponding optical fiber securing grooves and that opposed mirror surfaces of the two micro-mirrors form at right angles with each other. In such case, the four optical fiber securing grooves may be formed by applying either of a dry etching or an chemical anisotropic etching to the thick single crystal silicon layer.

In another aspect of the present invention, there is provided an optical switch manufactured by use of micromachining technology, which comprises: a first substrate comprising: a fixed electrode substrate; and a fixed electrode that is formed on the top surface of the fixed electrode substrate; a second substrate comprising: a thick single crystal silicon layer; a thin single crystal silicon layer; and an insulation layer that is interposed between the bottom surface of the thick single crystal silicon layer and the top surface of the thin single crystal silicon layer; a spacer that is interposed between the top surface of the first substrate on which the fixed electrode is formed and the thin single crystal silicon layer of the second substrate, and for juxtaposing the fixed electrode of the first substrate and the thin single crystal silicon layer of the second substrate substantially in parallel with each other with a predetermined gap therebetween; a movable plate-like electrode that is formed in the thin single crystal silicon layer of the second substrate; a plurality of flexible beam-like members for supporting the movable plate-like electrode to be movable toward and away from the fixed electrode, the flexible beam-like members being formed in the thin single crystal silicon layer of the second substrate integrally with the movable plate-like electrode; a plurality of optical fiber securing grooves that are formed on the thick single crystal silicon layer of the second substrate by applying an etching to the thick single crystal silicon layer; a micro-mirror having a plurality of mirror surfaces that is formed in a portion of the thick single crystal silicon layer of the second substrate positioned above the movable plate-like electrode by applying an etching to the thick single crystal silicon layer, the micro-mirror standing erect from the top surface of the movable plate-like electrode through the insulation layer, and the mirror surfaces being located on the extensions of the optical fiber securing grooves; and a through hole that is formed in the spacer and enables the movable plate-like electrode to approach the fixed electrode, and wherein the optical switch is constructed such that an optical path for an optical beam incident thereon is changed by electrostatically driving the movable plate-like electrode toward the fixed electrode thereby to displace the micro-mirror standing erect from the movable plate-like electrode.

In a second preferred embodiment, the micro-mirror has a generally cross shape in plan, and a first pair of wall surfaces of the generally cross-shaped micro-mirror forming at right angles with each other as well as a second pair of wall surfaces of the generally cross-shaped micro-mirror forming at right angles with each other and opposed to the first pair of wall surfaces are used as four mirror surfaces, the generally cross-shaped micro-mirror being formed on the top surface of the movable plate-like electrode through the insulation layer by applying a dry etching to the thick single crystal silicon layer in such manner that the four mirror surfaces form at an angle of 45° with the corresponding optical fiber securing grooves. A plurality of the optical fiber securing grooves is four, and the four optical fiber securing grooves are formed on the thick single crystal silicon layer by applying the dry etching to the thick single crystal silicon layer in such manner that two grooves are formed substantially in parallel with each other at one side of the micro-mirrors and the remaining two grooves are formed substantially in parallel with each other at the other side of the micro-mirrors in the longitudinal direction of the thick single crystal silicon layer, the two grooves at the one side and the two grooves at the other side being aligned with one another, and the groove surface of each optical fiber securing groove having a generally square shape.

In addition, the central portion including the crossing of the micro-mirror having a generally cross shape in plan is formed into a pillar the area of section of which is larger.

In a third preferred embodiment, the micro-mirror has a generally cross shape in plan, and a first pair of wall surfaces of the generally cross-shaped micro-mirror forming at right angles with each other as well as a second pair of wall surfaces of the generally cross-shaped micro-mirror forming at right angles with each other and opposed to the first pair of wall surfaces are used as four mirror surfaces, the generally cross-shaped micro-mirror being formed on the top surface of the movable plate-like electrode through the insulation layer by applying a dry etching to the thick single crystal silicon layer in such manner that the four mirror surfaces form at an angle of 45° with the corresponding optical fiber securing grooves. A plurality of the optical fiber securing grooves is four, and the four optical fiber securing grooves are formed on the thick single crystal silicon layer by applying an chemical anisotropic etching to the thick single crystal silicon layer in such manner that two grooves are formed substantially in parallel with each other at one side of the micro-mirrors and the remaining two grooves are formed substantially in parallel with each other at the other side of the micro-mirrors in the longitudinal direction of the thick single crystal silicon layer, the two grooves at the one side and the two grooves at the other side being aligned with one another, and the groove surface of each optical fiber securing groove having a generally V-shape.

In each of the embodiments, a plurality of minute protrusions that protrude from the top surface of the fixed electrode formed on the top surface of the fixed electrode substrate may be formed on the top surface of the fixed electrode substrate in order to prevent the sticking from occurring.

In addition, an SOI substrate of three layer structure that are constituted by a thick single crystal silicon layer, a silicon oxide layer formed on the bottom surface of the thick single crystal silicon layer, and a thin single crystal silicon layer joined to the bottom surface of the silicon oxide layer may be used as the second substrate.

With the construction as described above, by selecting the thickness of the spacer that is easy in manufacture, the electrode-to-electrode distance (gap) between the movable plate-like electrode and the fixed electrode can be easily set to a desired distance. Therefore, it is easy to set the electrode-to-electrode distance to a necessary and minimum distance. In addition, since there is no need to provide an elevated portion on the fixed electrode substrate unlike the prior art optical switches, the surface of the fixed electrode substrate on which the fixed electrode is to be formed is flat. Consequently, an electrode pattern for preventing the sticking from occurring or the like can easily be formed on the surface of the fixed electrode substrate with high accuracy.

DETAILED DESCRIPTION OF THE PREFERRED EMBODIMENTS

The preferred embodiments of the present invention will now be described in detail with reference to the accompanying drawings. The present invention may, however, be embodied in many different forms and should not be construed as limited to the embodiments set forth hereinafter; rather, the embodiments are provided so that this disclosure will be thorough and complete, and will fully convey the scope of the invention to those skilled in the art.

First, a first embodiment of the optical switch according to the present invention will be described in detail with reference to FIGS. 4 to 9. This first embodiment utilizes a mirror and V-shaped groove forming technique by use of an orientation-dependent wet etching or chemical anisotropic wet etching as described in, for example, the above-mentioned Japanese Patent Application No. 243582/2001 (or PCT/JP02/08177). In case such mirror and V-shaped groove forming technique by use of the orientation-dependent wet etching as described in the above-mentioned Japanese Patent Application No. 243582/2001 will be used, even if the etching time should not be controlled with high accuracy, two or four micro-mirrors erecting from the top surface of the movable plate-like electrode substantially at an angle of 90° thereto can be fabricated integrally with the movable plate-like electrode with high precision. At the same time, V-shaped grooves corresponding to the micro-mirrors can also be fabricated with high precision at locations each forming accurately an angle of 45° with the respective mirror surfaces of the micro-mirrors. Moreover, two mirror surfaces facing each other in the fabricated micro-mirrors forms accurately an angle of 45° with each other. Accordingly, it is possible to align each micro-mirror and each V-shaped groove corresponding thereto with each other with high accuracy, and hence an optical signal incident on the corresponding one micro-mirror from an output side optical fiber can always be inputted to an input side optical fiber by reflecting the optical signal two times by the two mirror surfaces facing each other with high accuracy with little optical loss.

Figure 3:
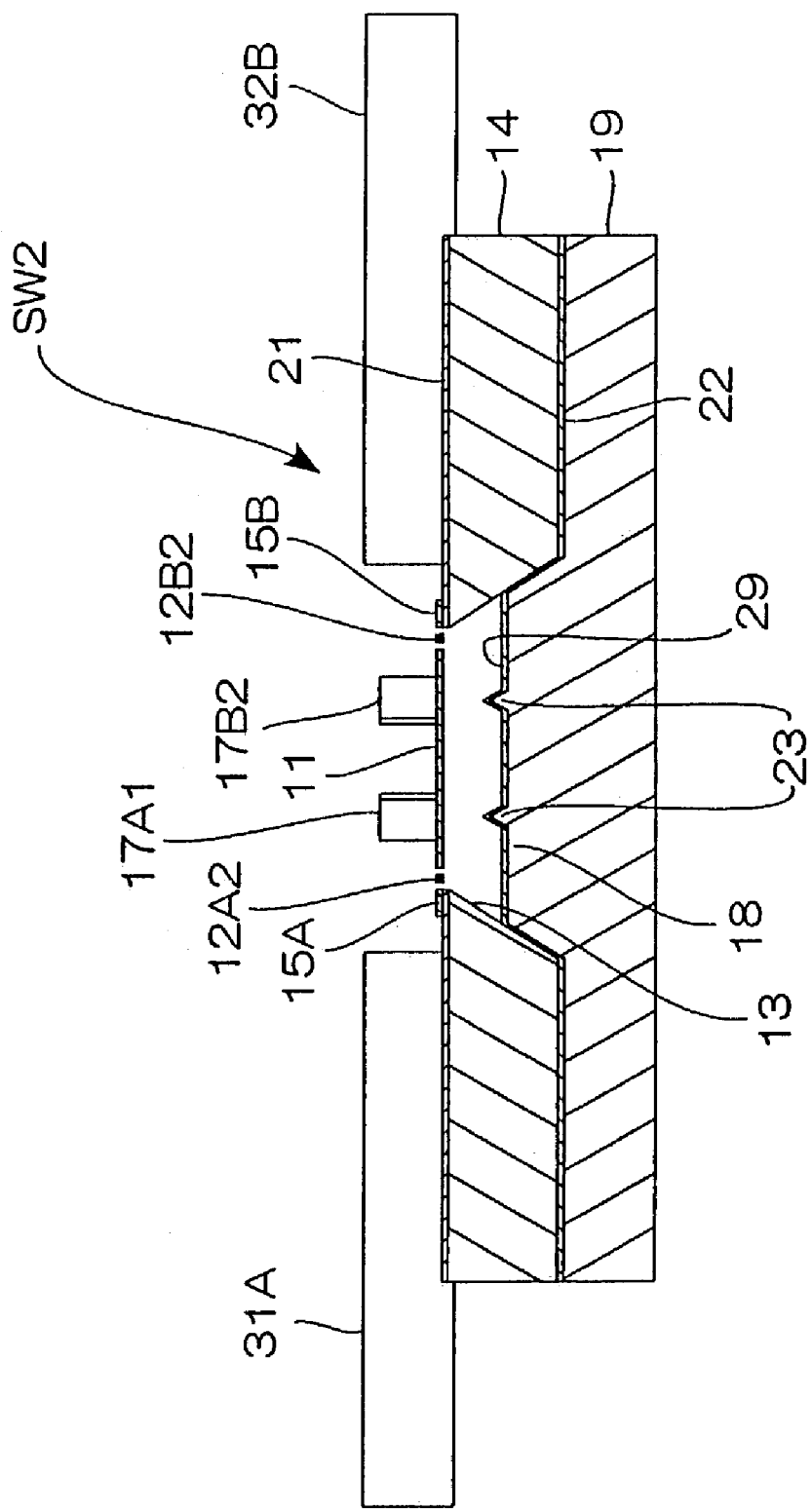
FIG. 3 is a sectional view similar to FIG. 2 showing another example of the prior art optical switch.
Figure 4:
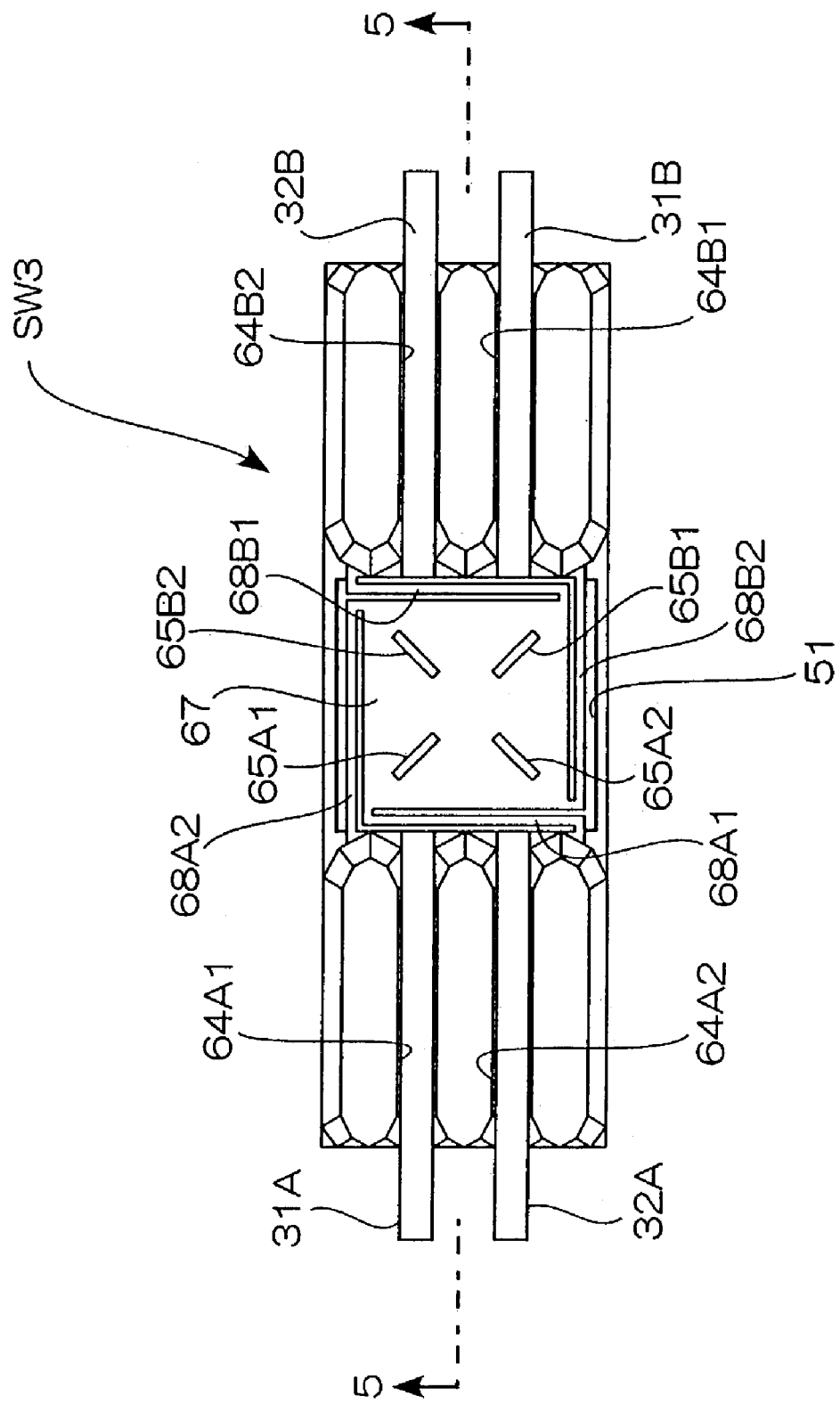
FIG. 4 is a plan view showing a first embodiment of the optical switch according to the present invention.
Figure 5:
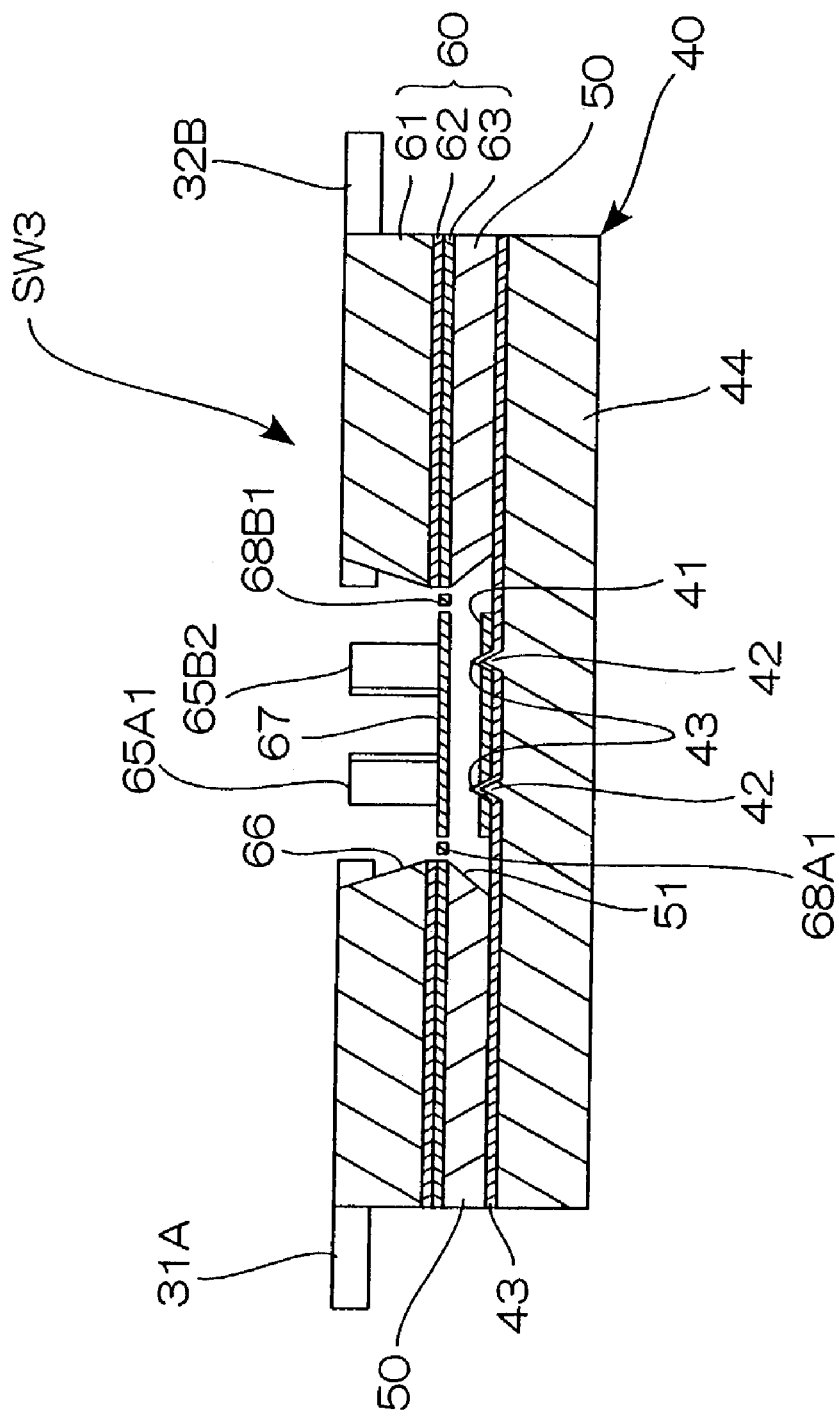
FIG. 5 is a sectional view taken along the line 5—5 in FIG. 4 and looking in the direction indicated by the arrows.
Figure 6:
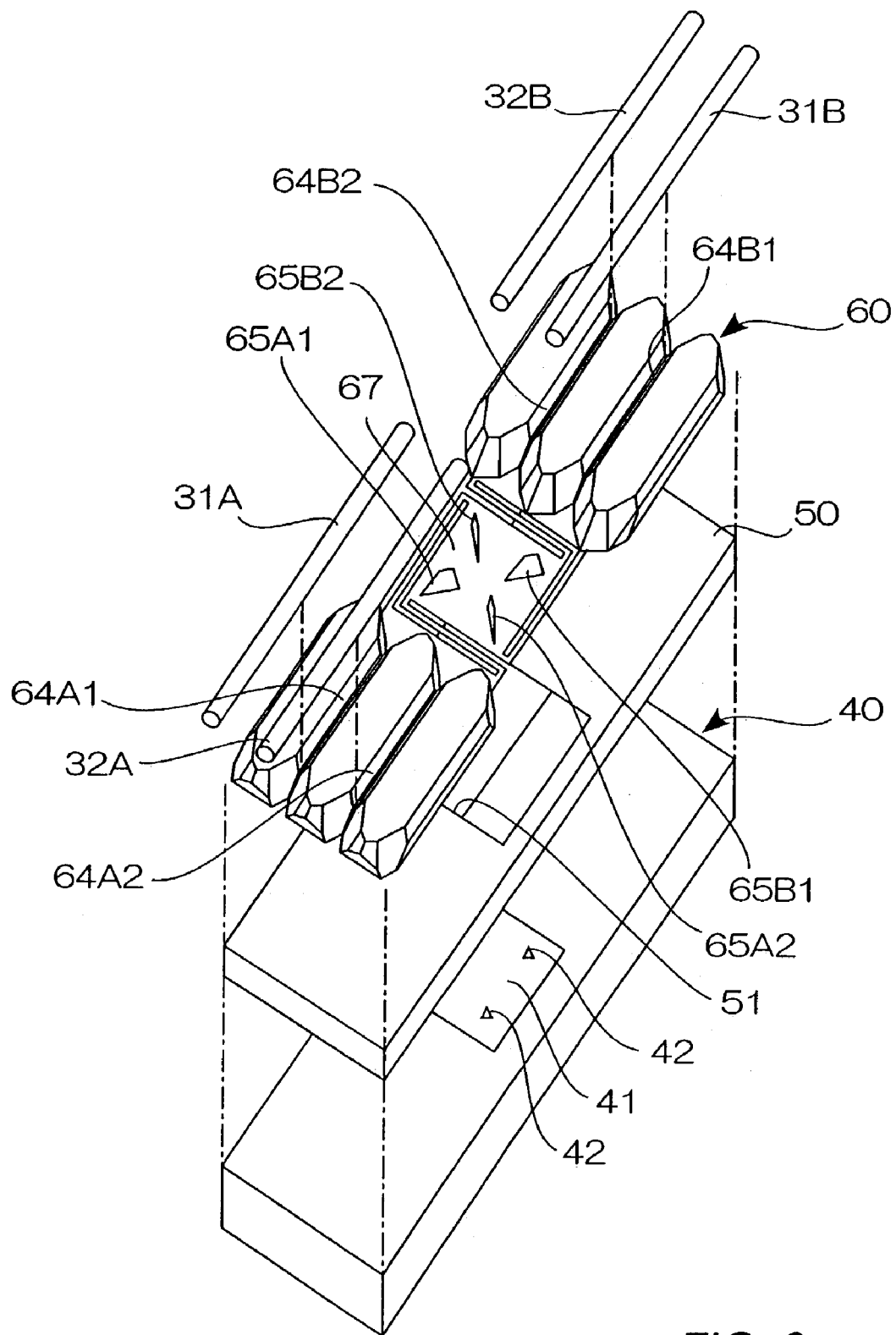
FIG. 6 is an exploded perspective view of the optical switch shown in FIG. 4.

FIG. 4 is a plan view showing a first embodiment of the optical switch according to the present invention together with optical fibers, FIG. 5 is a generally sectional view taken along the line 5—5 in FIG. 4 and looking in the direction indicated by the arrows, and FIG. 6 is an exploded perspective view of the first embodiment of the optical switch shown in FIG. 4. The optical switch SW3 of the first embodiment is also a 2×2 optical switch having the same construction and structure as those of the prior art optical switches already discussed with reference to FIGS. 1 to 3, and comprises: a first substrate (hereinafter, referred to as lower substrate) 40 of a generally rectangle in plan that is constituted by a thick single crystal silicon layer 44 of a generally rectangle in plan, an insulation layer (for example, silicon dioxide (SiO2) layer) 43 formed on the top surface of the thick single crystal silicon layer 44, and a fixed or stationary electrode 41 of a generally square in plan formed on the top surface of the insulation layer 43 at substantially central portion thereof, a second substrate (hereinafter, referred to as upper substrate) 60 of a generally rectangle in plan that is constituted by a thick single crystal silicon layer 61 of a generally rectangle in plan, an insulation layer (for example, silicon dioxide layer) 62 formed on the bottom surface of the thick single crystal silicon layer 61, and a thin single crystal silicon layer 63 formed on the bottom surface of the insulation layer 62; and a spacer 50 for juxtaposing the lower substrate 40 and the upper substrate 60 in parallel with each other with a predetermined space or gap therebetween.

In this embodiment, there is prepared an SOI (Silicon On Insulator) substrate of three layer structure comprising a thick single crystal silicon layer 61 of a generally rectangle in plan, a silicon dioxide layer formed on the top surface of the thick single crystal silicon layer 61 as the insulation layer 62, and a thin single crystal silicon layer 63 joined on the top surface of the silicon dioxide layer 62, and the SOI substrate is used as the upper substrate 60 by turning upside down as can be easily understood from FIG. 5. As will be described later on, from the thick single crystal silicon layer 61 of the upper substrate 60 can be fabricated by use of the orientation-dependent wet etching four thin plate-like micro-mirrors 65A1, 65A2, 65B1, and 65B2 as well as four V-shaped grooves 64A1, 64A2, 64B1, and 64B2 in which optical fibers 31A, 32A, 31B, and 32B are to be mounted respectively. In case of fabricating the four thin plate-like micro-mirrors 65A1, 65A2, 65B1, and 65B2, the thick single crystal silicon layer 61 existing in the periphery of the micro-mirrors is etched and removed in a generally square in plan, and an opening 66 of a generally square in plan is concurrently formed in the thick single crystal silicon layer 61. Since the four micro-mirrors 65A1, 65A2, 65B1, and 65B2 are formed at substantially the central portion of the thick single crystal silicon layer 61, the opening 66 is also formed at substantially the central portion of the thick single crystal silicon layer 61, and the four V-shaped grooves 64A1, 64A2, 64B1, and 64B2 are formed on the top surface of the thick single crystal silicon layer 61 along the longitudinal direction thereof, two grooves being formed in parallel with each other on the top surface of the thick single crystal silicon layer 61 at one side of the opening 66 and the remaining two grooves being formed in parallel with each other on the top surface of the thick single crystal silicon layer 61 at the other side of the opening 66. Further, in this embodiment, there is used the SOI substrate having the thick single crystal silicon layer 61 the top surface of which is (100) crystal face, and the orientation-dependent wet etching is applied to this thick single crystal silicon layer 61.

On the other hand, from the thick single crystal silicon layer 61 of the upper substrate 60 can be fabricated by photolitliography technology the movable plate-like electrode 67 of a generally square in plan and the four flexible beams (each called flexure) 68A1, 68A2, 68B1, and 68B2 for supporting the movable plate-like electrode 67 to be movable toward and away from the lower substrate 40 integrally with one another. The movable plate-like electrode 67 is formed so as to be positioned under the opening 66 in the thick single crystal silicon layer 61, and the four thin plate-like micro-mirrors 65A1, 65A2, 65B1, and 65B2 are upright from the top surface of the movable plate-like electrode 67. Consequently, the four micro-mirrors exist within the opening 66 when the movable plate-like electrode 67 is not driven. Further, it is needless to say that the opening 66 of a generally square formed in the thick single crystal silicon layer 61 has such a size that it can accommodate the movable plate-like electrode 67 and the four beams 68A1, 68A2, 68B1, and 68B2 therein.

The micro-mirrors 65A1, 65A2, 65B1, and 65B2 are fabricated by forming four thin plate-like mirror bodies of single crystal silicon by applying a chemical anisotropic etching to the thick single crystal silicon layer 61 of the upper substrate 60, and coating the wall surfaces of the thin plate-like mirror bodies with a metal such as gold (Au), etc., or a double layer film of gold and chromium.

Each of the four flexible beams 68A1, 68A2, 68B1, and 68B2 extends from corresponding one of the edges of the thin single crystal silicon layer 63 opposed to each other through the opening 66 put therebetween along corresponding one of the four sides of the movable plate-like electrode 67, two beams extending from one edge of the thin single crystal silicon layer 63 and the remaining two beams extending from the other edge of the thin single crystal silicon layer 63. The free end of each beam is connected integrally with corresponding one of the four corners of the movable plate-like electrode 67. In this embodiment, the bases of the two beams 68A1 and 68A2 are connected integrally with the edge of the thin single crystal silicon layer 63 that is positioned at the left side in FIG. 4, and the bases of the remaining two beams 68B1 and 68B2 are connected integrally with the edge of the thin single crystal silicon layer 63 that is positioned at the right side in FIG. 4.

Each of the four V-shaped grooves 64A1, 64A2 and 64B1, 64B2 extends from corresponding one of the opposed sides of the opening 66 to corresponding one of the opposed ends of the thick single crystal silicon layer 61 in the longitudinal direction thereof, and the two V-shaped grooves 64A1 and 64B2 and the two V-shaped grooves 64A2 and 64B1 opposed to one another through the opening 66 put therebetween in the longitudinal direction of the thick single crystal silicon layer 61 are aligned with one another.

The four thin plate-like micro-mirrors 65A1, 65A2, 65B1, and 65B2 have substantially the same shape and size with one another, and the two micro-mirrors 65A1 and 65B1 are disposed on a first straight line that passes through substantially the center of the movable plate-like electrode 67 and forms an angle of 45° with a horizontal line. The remaining two micro-mirrors 65A2 and 65B2 are disposed on a second straight line that passes through substantially the center of the movable plate-like electrode 67 and is orthogonal to the first straight line. These micro-mirrors 65A1, 65A2, 65B1, and 65B2 are disposed at such positions that they are away by substantially the same distance in the radial direction from the intersection between the first and second straight lines and that axial lines of corresponding two V-shaped grooves 64A1 and 64B2 and of corresponding two V-shaped grooves 64A2 and 64B1 pass through substantially the centers of the micro-mirrors.

Optical fibers are located and secured in the four V-shaped grooves 64A1, 64A2 and 64B1, 64B2, respectively. In this embodiment, an output side optical fiber 31A and an input side optical fiber 32A are located and secured in the V-shaped grooves 64A1 and 64A2 positioned in the left side in FIG. 4, respectively, and in the V-shaped grooves 64B1 and 64B2 positioned in the right side in FIG. 4 are located and secured an output side optical fiber 31B and an input side optical fiber 32B, respectively. As a result, the output side optical fiber 31A secured in the V-shaped groove 64A1 and the input side optical fiber 32B secured in the V-shaped groove 64B2 are opposed to and aligned to each other (are disposed on the same optical axis line), and the input side optical fiber 32A secured in the V-shaped groove 64A2 and the output side optical fiber 31B secured in the V-shaped grooves 64B1 are opposed to and aligned to each other (are disposed on the same optical axis line). Further, each of the V-shaped grooves 64A1, 64A2, 64B1, and 64B2 has its groove surface that forms a V-shape of (111) crystal face.

The lower substrate 40 of a generally rectangle has substantially the same shape and size in plan as those of the upper substrate 60, and the fixed electrode 41 of a generally square in plan that is formed on substantially the central portion of the top surface of the insulation layer (silicon dioxide layer in this embodiment) 43 of a generally rectangle has substantially the same shape and size in plan as those of the movable plate-like electrode 67 and is opposed to and juxtaposed in parallel with the movable plate-like electrode 67 with a predetermined space or gap therebetween. In this embodiment, a plurality of minute protrusions 42 are formed, for example, in a matrix manner on the top surface of the thick single crystal silicon layer 44, the minute protrusions 42 being formed in the area in which the fixed electrode 41 is formed and projecting just a little from the top surface of the fixed electrode 41. In addition, the fixed electrode 41 is made of a double layer film of gold/chromium.

The spacer 50 is a plate-like member of a generally rectangle in plan that has a predetermined thickness and a through hole 51 of a generally square in plan formed in substantially the central portion thereof. The spacer 50 has substantially the same shape and size in plan as those of the lower substrate 40, and may be made of, for example, a single crystal silicon substrate. The through hole 51 of the spacer 50 is formed at a position that faces the opening 66 of the thick single crystal silicon layer 61 and has substantially the same shape and size in plan as those of the opening 66.

The spacer constructed above is interposed between the upper substrate 60 and the lower substrate 40 both constructed as discussed above to give a predetermined electrode-to-electrode distance or gap between the fixed electrode 41 of the lower substrate 40 and the movable plate-like electrode 67 of the upper substrate 60. The top surface of the spacer 50 is joined to the bottom surface of the thin single crystal silicon layer 63 of the upper substrate 60 with a suitable adhesive, and likewise, the bottom surface of the spacer 50 is joined to the top surface of the silicon dioxide layer 43 of the lower substrate 40 with a suitable adhesive so that the upper substrate 60, the spacer 50 and the lower substrate 40 are formed into one body and thus the optical switch SW3 shown in FIGS. 4 and 5 is constructed. Further, instead of using an adhesive, they may be joined to one another by use of solder, or alternatively, by direct joining such as electrostatic joining.

In this manner, the upper substrate 60, the spacer 50 and the lower substrate 40 are joined and formed into one body so that the movable plate-like electrode 67 is opposed to and juxtaposed in parallel with the fixed electrode 41 with a predetermined electrode-to-electrode distance (gap) therebetween and can be moved or displaced toward and away from the fixed electrode 41 within the opening 66 and the through hole 51 by the four beams 68A1, 68A2, 68B1, and 68B2 for supporting the movable plate-like electrode 67.

Next, a method of manufacturing the upper substrate 60 constructed as discussed above will be described in sequence of manufacturing processes with reference to FIGS. 7A to 7I.

Figure 7A:
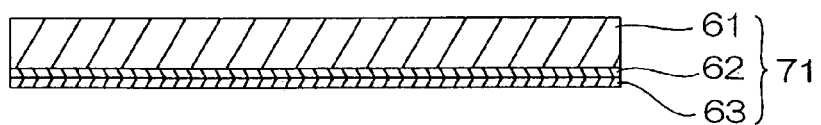
FIGS. 7A to 7I are sectional views for explaining a method of manufacturing an upper substrate of the optical switch shown in FIG. 4 in sequence of manufacturing processes.

At first, as shown in FIG. 7A, an SOI substrate 71 of a generally rectangle in plan is prepared by turning upside down. In general, the SOI substrate is constituted by three layers consisting of a support substrate of thick single crystal silicon, an insulation layer on the top surface of the support substrate, and a thin single crystal silicon layer on the top surface of the insulation layer. In this example, since the SOI substrate is used by turning upside down, in FIG. 7A, the thick single crystal silicon layer 61 is placed at the uppermost position, an insulation layer 62 consisting of silicon dioxide layer is formed on the bottom surface of the thick single crystal silicon layer 61, and the thin single crystal silicon layer 63 is joined to the bottom surface of the silicon dioxide layer 62. The thick single crystal silicon layer 61 has its top surface of (100) crystal face.

Figure 7B:
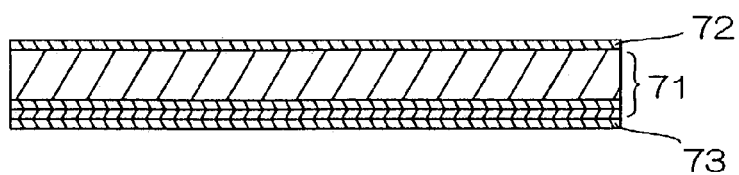

Next, the overall surfaces of the SOI substrate 71 are oxidized. As a result, as shown in FIG. 7B, an oxide film (silicon dioxide layer) 72 is formed on the top surface of the thick single crystal silicon layer 61 of the SOI substrate 71 that is the uppermost layer thereof, and at the same time, an oxide film (silicon dioxide layer) 73 is formed on the bottom surface of the thin single crystal silicon layer 63 of the SOI substrate 71 that is the lowermost layer thereof.

Figure 7C:
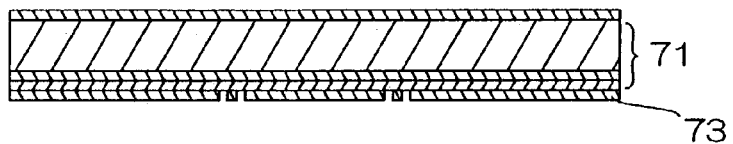

Then, by use of photolithography technology, a patterning of the oxide film 73 formed on the bottom surface of the thin single crystal silicon layer 63 is carried out to leave portions of the oxide film 73 corresponding to the shapes or patterns of the four beams 68A1, 68A2, 68B1, and 68B2 and the movable plate-like electrode 67 respectively, as shown in FIG. 7C.

Figure 7D:
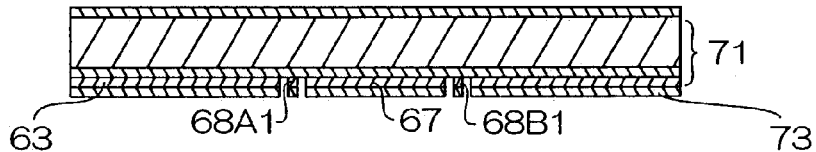

Thereafter, the thin single crystal silicon layer 63 of the SOI substrate 71 that is the lowermost layer thereof is etched using the patterned oxide film 73 as a mask, thereby to form the movable plate-like electrode 67 and the four beams 68A1, 68A2, 68B1, and 68B2 as shown in FIG. 7D.

Figure 7E:
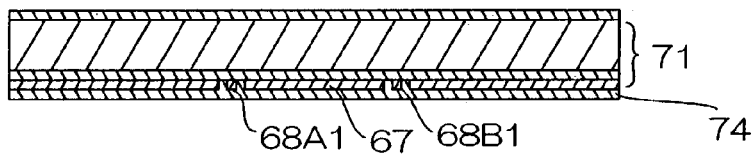

Next, the remaining oxide film 73 is removed, and thereafter, as shown in FIG. 7E, an oxide film 74 is again formed on the bottom surface of the SOI substrate 71. Alternatively, the overall surfaces of the SOI substrate 71 may be oxidized without removing the remaining oxide film 73.

Figure 7F:
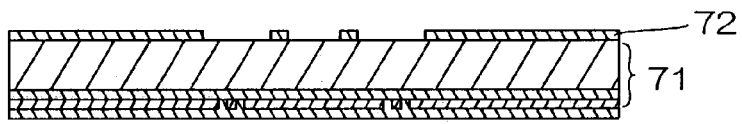

Then, a patterning of the oxide film 72 formed on the top surface of the thick single crystal silicon layer 61 is carried out to leave portions of the oxide film 72 corresponding to the shapes or patterns of the four micro-mirrors 65A1, 65A2, 65B1, and 65B2 and the four V-shaped grooves 64A1, 64A2, 64B1, and 64B2 respectively, as shown in FIG. 7F.

Figure 7G:
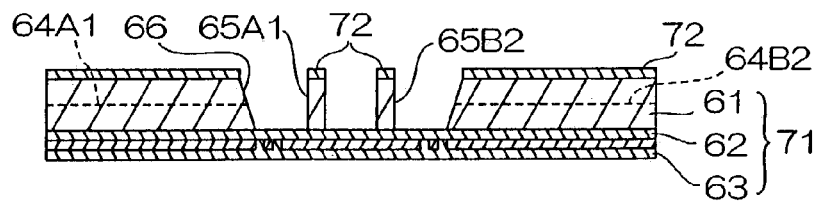

Next, the thick single crystal silicon layer 61 of the SOI substrate 71 that is the uppermost layer thereof is etched by the chemical anisotropic wet etching using the patterned oxide film 72 as a mask, thereby to form the four V-shaped grooves 64A1, 64A2, 64B1, and 64B2 (64A2 and 64B1 are not seen in FIG. 7G) on the top surface of the thick single crystal silicon layer 61 as well as to form the four micro-mirrors 65A1, 65A2, 65B1, and 65B2 (65A2 and 65B1 are not seen in FIG. 7G) of the thick single crystal silicon layer that erect from the top surface of the movable plate-like electrode 67 through the silicon dioxide layer 62, as shown in FIG. 7G.

Figure 7H:
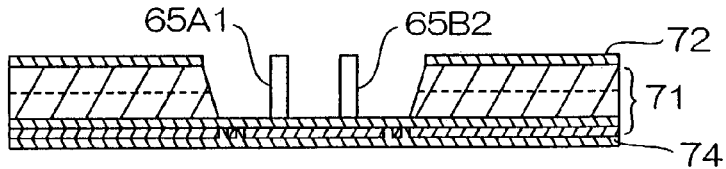

Then, as shown in FIG. 7H, the surfaces (including the oxide film 72 on the top surface of each micro-mirror) of the micro-mirrors 65A1, 65A2, 65B1, and 65B2 are coated with a double layer film of gold and chromium to form mirror surfaces thereon.

Figure 7I:
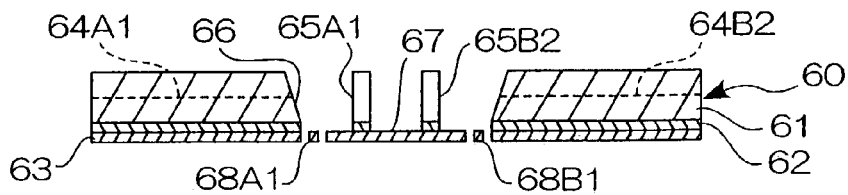

Thereafter, as shown in FIG. 7I, the oxide layers 72 and 74 remaining on the top surface and the bottom surface of the SOI substrate 71 respectively are removed. Thus, the upper substrate 60 is completed.

Next, a method of manufacturing the lower substrate 40 constructed as discussed above will be described in sequence of manufacturing processes with reference to FIGS. 8A to 8G.

Figure 8A:
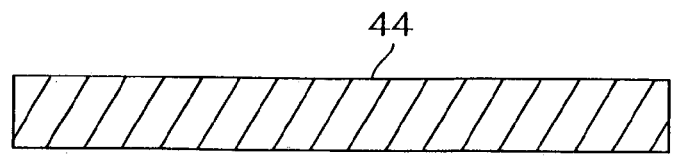
FIGS. 8A to 8G are sectional views for explaining a method of manufacturing a lower substrate of the optical switch shown in FIG. 4 in sequence of manufacturing processes.

At first, a single crystal silicon substrate 44 of a generally rectangle in plan having a predetermined thickness is prepared as shown in FIG. 8A.

Figure 8B:
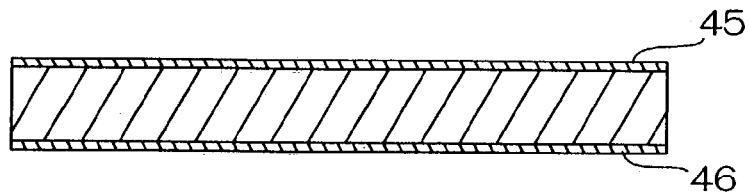

Next, the overall surfaces of the single crystal silicon substrate 44 are oxidized to form, as shown in FIG. 8B, an oxide film 45 and an oxide film 46 on the top surface and the bottom surface of the single crystal silicon substrate 44, respectively.

Figure 8C:
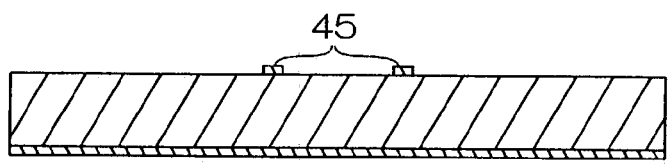

Then, a patterning of the oxide film 45 formed on the top surface of the single crystal silicon substrate 44 is executed to leave portions of the oxide film 45 corresponding to the shape or pattern of the plural protrusions 42, as shown in FIG. 8C.

Figure 8D:
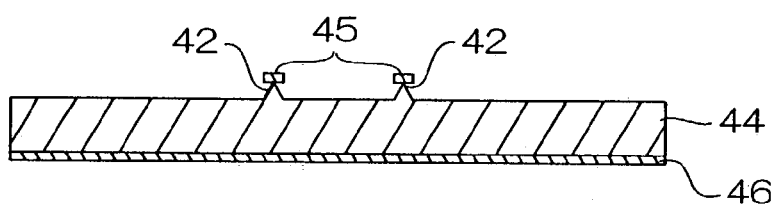

Thereafter, the single crystal silicon substrate 44 is etched by the chemical anisotropic wet etching using the patterned oxide film 45 as a mask, thereby to form the plural minute protrusions 42 on the top surface of the single crystal silicon substrate 44 at substantially the central portion thereof, as shown in FIG. 8D.

Figure 8E:
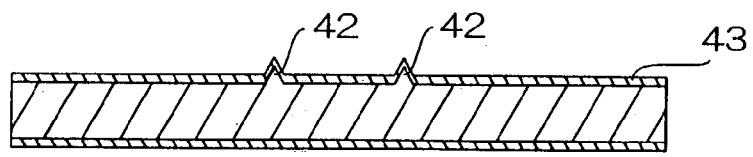

Next, the oxide film 45 remaining on the top of the protrusions 42 is removed, and thereafter, as shown in FIG. 8E, an oxide film 43 is again formed on the top surface of the single crystal silicon substrate 44 including the protrusions 42.

Figure 8F:
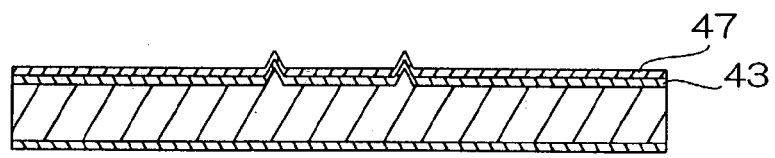

Then, as shown in FIG. 8F, a double layer film 47 of gold/chromium is formed on the top surface of the oxide film 43 with the chromium layer as foundation. The thickness of the double layer film 47 is set to a value that is lower than the height (or thickness) of the oxide film 43 covering the plural very small protrusions 42.

Thereafter, the gold/chromium double layer film 47 is removed except for a portion thereof corresponding to the fixed electrode 41. At that time, the double layer film 47 covering the protrusions 42 is also removed.

Figure 8G:
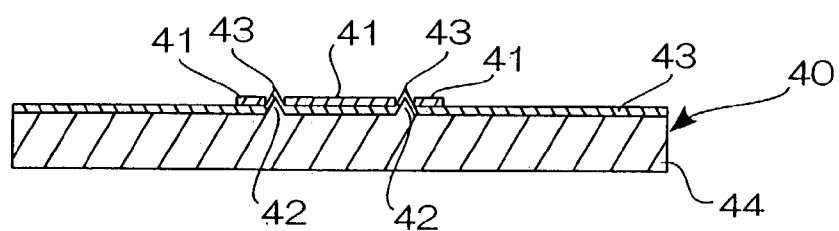

Thus, as shown in FIG. 8G, there is completed the lower substrate 40 in which the fixed electrode 41 of a generally square in plan is formed on substantially central portion of the single crystal silicon substrate 44 through the oxide film 43 and the portions of the oxide film 43 covering the protrusions 42 protrude from the top surface of the fixed electrode 41. Further, the fixed electrode 41 is not limited to the gold/chromium double layer film 47.

Next, a method of manufacturing the spacer 50 constructed as discussed above will be described in sequence of manufacturing processes with reference to FIGS. 9A to 9E.

Figure 9A:
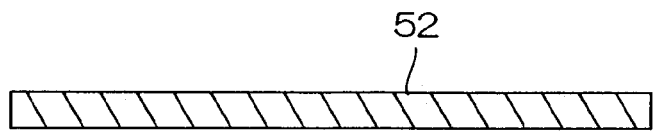
FIGS. 9A to 9E are sectional views for explaining a method of manufacturing a spacer of the optical switch shown in FIG. 4 in sequence of manufacturing processes.

At first, a single crystal silicon substrate 52 of a generally rectangle in plan having a predetermined thickness is prepared as shown in FIG. 9A.

Figure 9B:
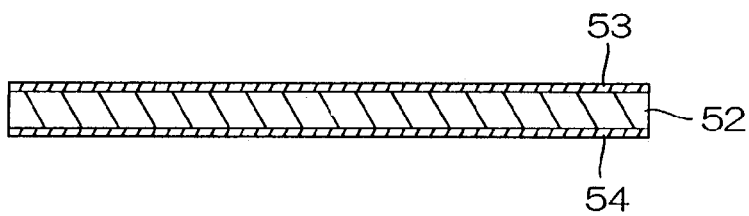

Next, the overall surfaces of the single crystal silicon substrate 52 are oxidized to form, as shown in FIG. 9B, an oxide film 53 and an oxide film 54 on the top surface and the bottom surface of the single crystal silicon substrate 52, respectively.

Figure 9C:
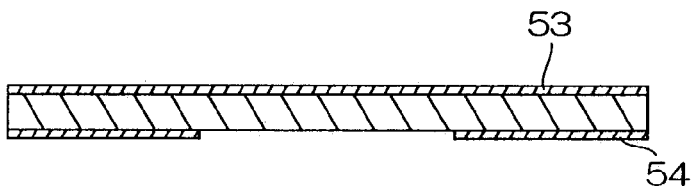

Then, a patterning of the oxide film 54 formed on the bottom surface of the single crystal silicon substrate 52 is carried out to remove a portion of the oxide film 54 corresponding to the shape or pattern of the through hole 51, as shown in FIG. 9C.

Figure 9D:
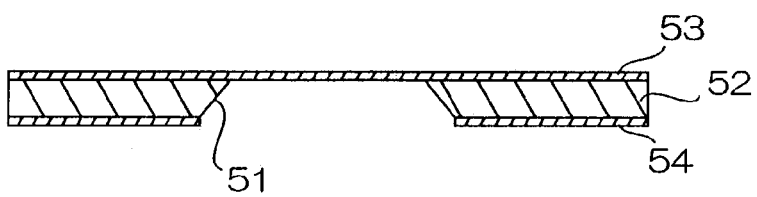

Thereafter, the single crystal silicon substrate 52 is etched by use of, for example, KOH solution using the patterned oxide film 54 as a mask, thereby to form the through hole 51, as shown in FIG. 9D.

Figure 9E:

Next, the oxide films 53 and 54 on the top surface and the bottom surface of the single crystal silicon substrate 52 respectively are removed as shown in FIG. 9E. Thus, there is completed the spacer 50 of a predetermined thickness in which the through hole 51 of a generally square in plan is formed on substantially central portion of the spacer 50.

In such manner, the upper substrate 60, the lower substrate 40 and the spacer 50 having the same construction, structure and shape as those of them shown in FIGS. 4 and 5 are respectively manufactured, and the optical switch SW3 is completed by joining the upper substrate 60 and the lower substrate 40 through the spacer 50 interposed therebetween thereby to form them into one body.

In the optical switch SW3 constructed as described above, since the upper substrate 60 having the movable plate-like electrode 67 formed thereon is joined to the lower substrate 40 having the fixed electrode 41 formed thereon by the spacer 50 interposed therebetween, the electrode-to-electrode distance (gap) between the movable plate-like electrode 67 and the top surface of the fixed electrode 41 is set depending upon the thickness of the spacer 50. Accordingly, by selecting the thickness of the spacer 50 to a desired thickness, the electrode-to-electrode distance can be easily set to a desired distance. Consequently, it is easily done that in order to decrease the drive voltage as low as possible, the electrode-to-electrode distance is set to a necessary and minimum distance.

Figure 1:
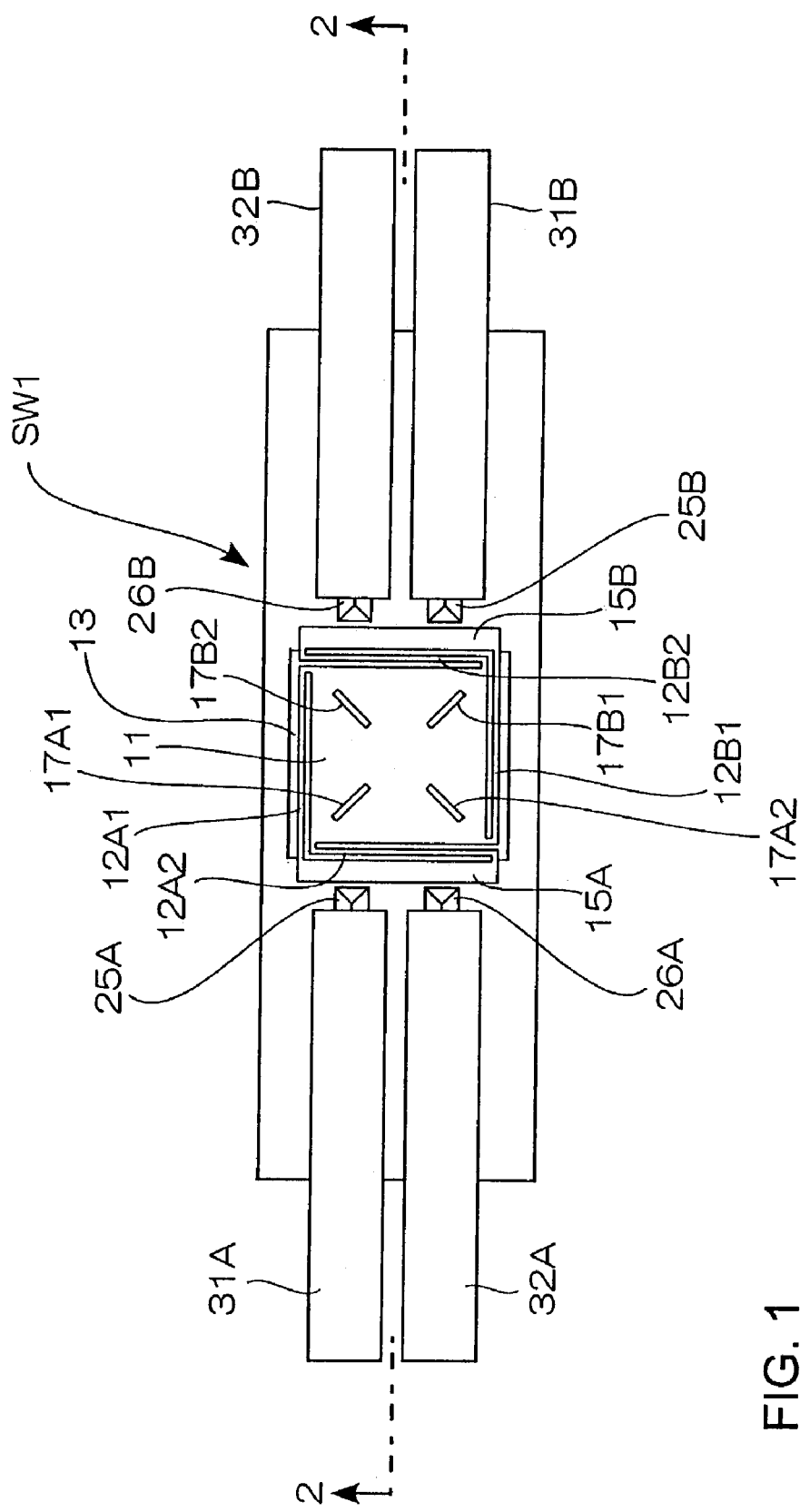
FIG. 1 is a plan view showing an example of the prior art optical switch.
Figure 2:
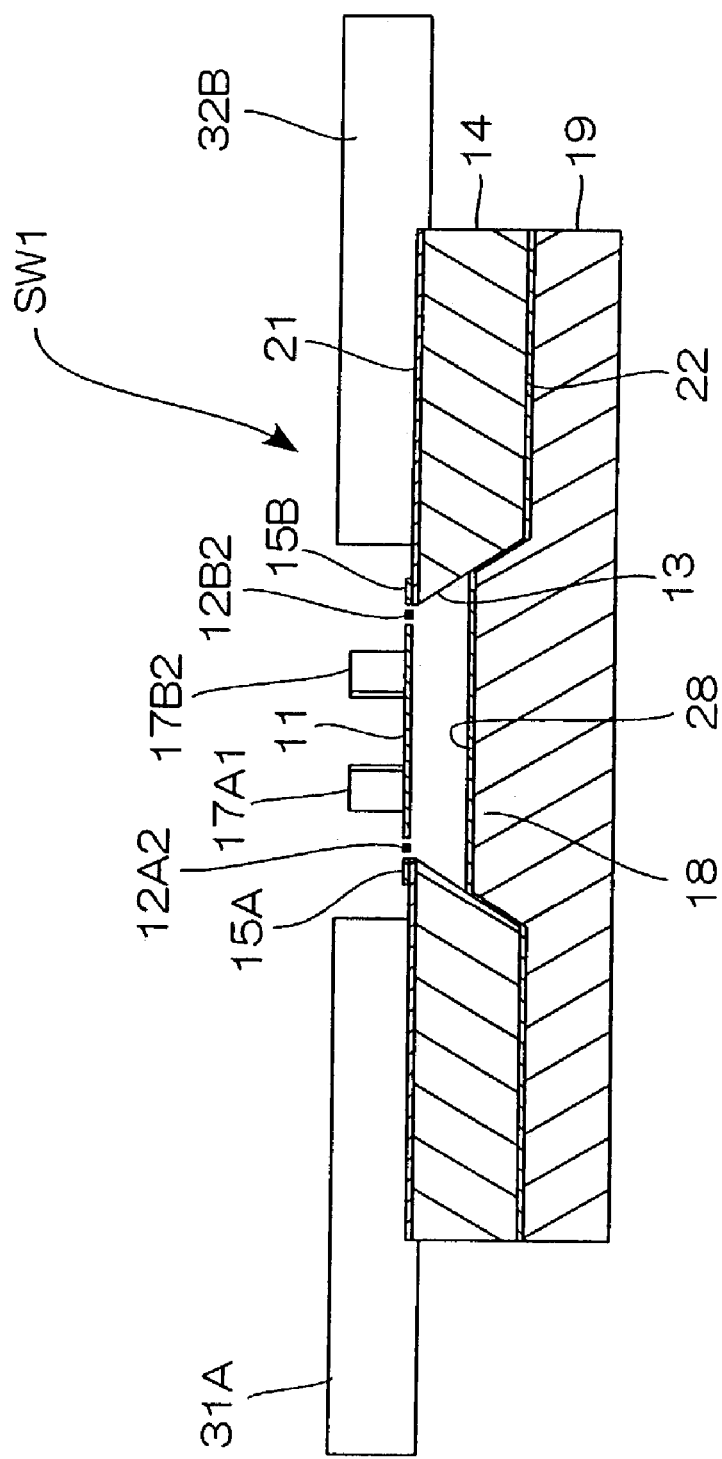
FIG. 2 is a sectional view taken along the line 2—2 in FIG. 1 and looking in the direction indicated by the arrows.

In addition, since the optical switch SW3 is constructed such that the electrode-to-electrode distance is set by the spacer 50, there is no need to provide an elevated portion on the fixed electrode substrate (the lower substrate) unlike the prior art optical switches SW1 and SW2 shown in FIGS. 1 to 3, that is, the lower substrate 40 has its flat top surface. Therefore, various types of patternings can easily be done on the top surface of the lower substrate 40 with high precision. As a result, it can easily be carried out with high accuracy to form a plurality of the protrusions 42 for preventing the sticking from occurring in a matrix manner on the top surface of the lower substrate 40 and to form the fixed electrode 41 of a predetermined shape on the top surface of the lower substrate 40, as in the first embodiment.

Moreover, in this embodiment, the four micro-mirrors 65A1, 65A2, 65B1, 65B2 and the four V-shaped grooves 64A1, 64A2, 64B1, 64B2 are concurrently formed by applying the chemical anisotropic wet etching to the same thick single crystal silicon layer 61 having its top surface of (100) crystal face. For that reason, as described in the above-mentioned Japanese Patent Application No. 243582/2001 (or PCT/JP02/08177), or the above-mentioned paper by Philippe Helin, et al., the vertical surface of each micro-mirror forming at right angles with a horizontal plane becomes (100) crystal face, and the accuracy in verticality and flatness of each micro-mirror comes to much high. Accordingly, an input optical beam can be reflected with little optical loss and no deviation of the reflected optical beam occurs in vertical direction.

When the four micro-mirrors 65A1, 65A2, 65B1, 65B2, each having its mirror surface of (100) crystal face and opposed two mirror surfaces forming at right angles with each other, and the four V-shaped grooves 64A1, 64A2, 64B1, 64B2 to be aligned with the micro-mirrors for locating and securing optical fibers therein are concurrently formed by applying the chemical anisotropic wet etching to the same thick single crystal silicon layer having its top surface of (100) crystal face using the identical etchant, each micro-mirror and a V-shaped groove corresponding thereto are aligned with each other with high accuracy. In addition, mask patternings before the chemical anisotropic wet etching is carried out can be done at the same time. Moreover, since the chemical anisotropic wet etching is carried out only once, the micro-mirrors and the V-shaped grooves can be formed at the same time by one mask patterning and one chemical anisotropic wet etching, which results in a remarkable improvement in working efficiency or manufacturing process.

Furthermore, as the micro-mirrors and the V-shaped grooves are concurrently formed by the chemical anisotropic wet etching, the thick single crystal silicon layer is etched at the same time using the identical etchant, and hence the etching rate for the mirror surfaces of the micro-mirrors facing each other and the etching rate for the adjacent V-shaped grooves 64A1, 64A2 and 64B1, 64B2 (each groove surface being (111) crystal face) in parallel with each other can be controlled to become substantially the same rate. Accordingly, it is possible that a deviation in the axis of optical path due to errors in the etching rate, the etching time, and the like is made substantially zero, and therefore, optical beams emitted respectively from the output side optical fibers 31A and 31B that are located and fixed in the V-shaped grooves 64A1 and 64B1 respectively can be reflected substantially perfectly by the micro-mirrors and incident on the corresponding input side optical fibers 32A and 32B that are located and fixed in the V-shaped grooves 64A2 and 64B2 respectively. Further, the details thereof will be referred to the above-mentioned Japanese Patent Application No. 243582/2001 (or PCT/JP02/08177).

Like the first embodiment, if there is adopted the construction in which two V-shaped grooves 64A1 and 64A2 are juxtaposed in parallel with each other at one side of the movable plate-like electrode 67 and two V-shaped grooves 64B1 and 64B2 are juxtaposed in parallel with each other at the other side of the movable plate-like electrode 67, a multi-channel 2×2 optical switch can be manufactured in a small space.

Figure 10:
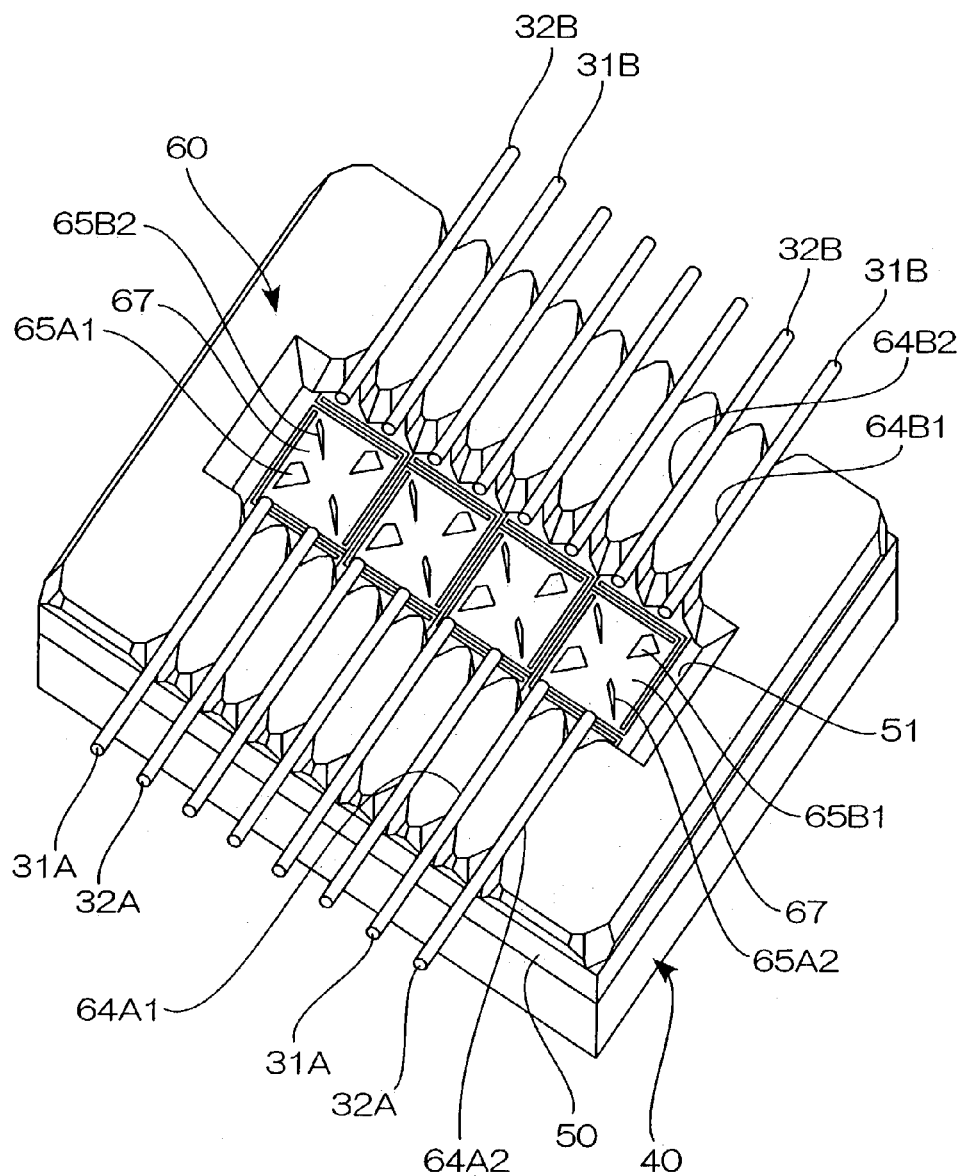
FIG. 10 is a perspective view showing a modified embodiment of the optical switch according to the present invention.

FIG. 10 is a perspective view showing a modified embodiment of the optical switch according to the present invention, and illustrates a four channel 2×2 optical switch in which four of the optical switches SW3 of the first embodiment shown in FIG. 4 are juxtaposed in parallel with one another. It is clear that the modified embodiment of the optical switch can be manufactured by the same manufacturing method as that of the optical switch of the first embodiment and the same function and effects can be obtained. Accordingly, in FIG. 10, portions and elements corresponding to those shown in FIGS. 4 and 5 will be denoted by the same reference characters attached thereto, and explanation thereof will be omitted. Further, the number of channels may be changed depending upon uses of the optical switch, and is not limited to four channels.

In the above-mentioned first embodiment and the modified embodiment, the four micro-mirrors 65A1, 65A2, 65B1, 65B2 and the four V-shaped grooves 64A1, 64A2, 64B1, 64B2 have been concurrently formed by applying the chemical anisotropic wet etching to the thick single crystal silicon layer 61, but the micro-mirrors and the V-shaped optical fiber securing grooves may be formed by applying a dry etching to the thick single crystal silicon layer 61.

Figure 11:
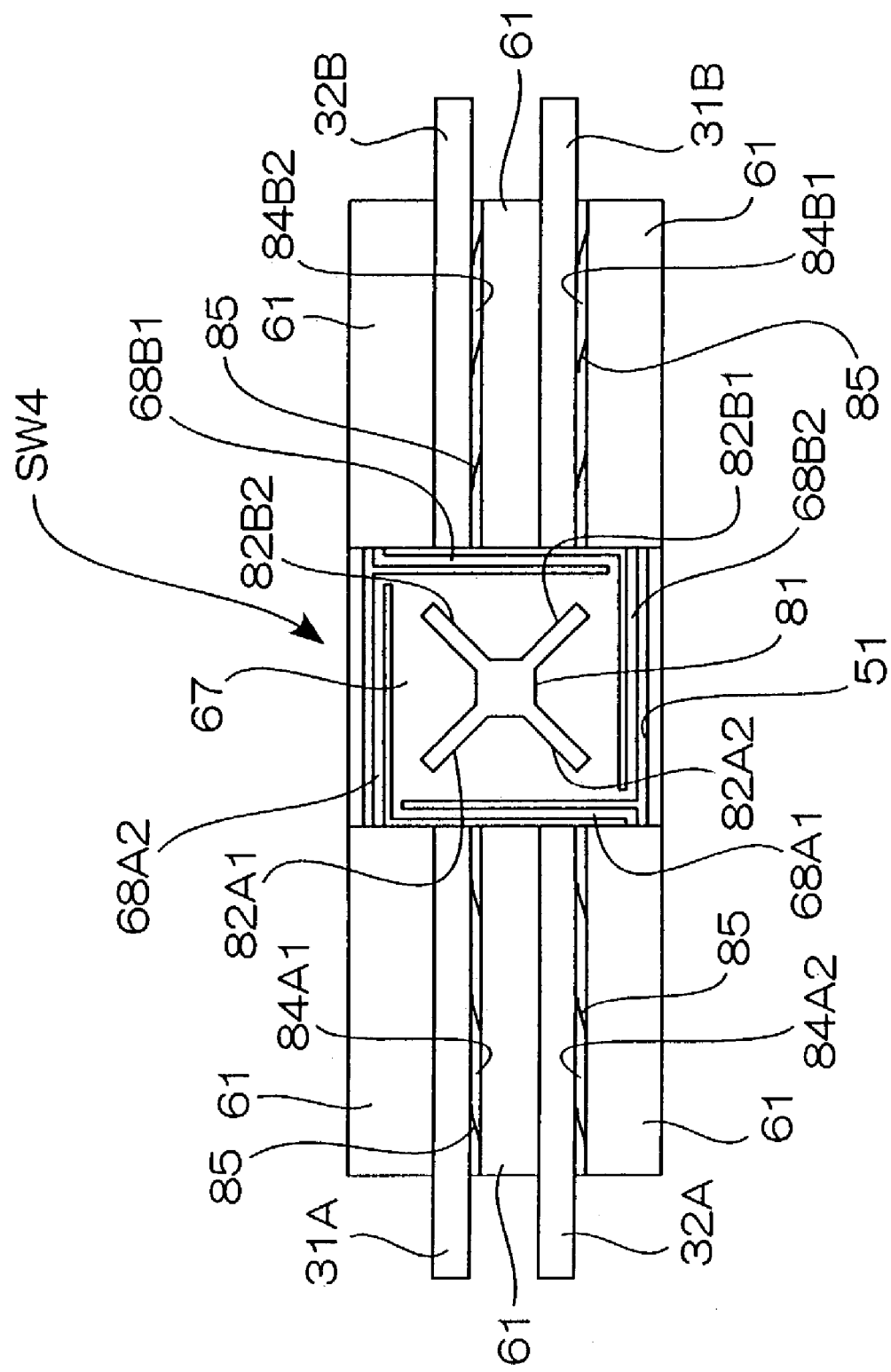
FIG. 11 is a plan view showing a second embodiment of the optical switch according to the present invention.

FIG. 11 is a plan view showing a second embodiment of the optical switch according to the present invention. The optical switch SW4 of the second embodiment is a 2×2 optical switch having the same construction and structure as those of the optical switch SW3 of the first embodiment already discussed with reference to FIGS. 4 to 6 except for micro-mirrors and optical fiber securing grooves, and so in FIG. 11, portions and elements corresponding to those shown in FIGS. 4 to 6 will be denoted by the same reference characters attached thereto, and explanation thereof will be omitted unless necessary.

In the second embodiment, the thick single crystal silicon layer 61 (not seen in FIG. 11) is etched by a dry etching to form a micro-mirror 81 on the top surface of the movable plate-like electrode 67 at substantially the central portion thereof through the insulation layer 62 (not seen in FIG. 11) integrally with the movable plate-like electrode 67. The micro-mirror 81 has a generally cross shape (a shape formed by two line segments meeting at right angles or St. Andrew's cross) in plan and its central portion has a quadrangular or right prism-like shape. A first pair of wall surfaces 82A1 and 82A2 of the generally cross-shaped micro-mirror 81 that form at right angles with each other as well as a second pair of wall surfaces 82B1 and 82B2 of the generally cross-shaped micro-mirror 81 that are opposed to the first pair of wall surfaces 82A1 and 82A2 and form at right angles with each other are coated with, for example, gold (Au) or a double layer film of gold/chromium to form mirror surfaces on the wall surfaces 82A1, 82A2 and 82B1, 82B2 so that the micro-mirror 81 has four mirror surfaces. As a result, the first pair of wall surfaces 82A1 and 82A2 correspond to, for example, the mirror surfaces of the two micro-mirrors 65A1 and 65A2 in the first embodiment respectively, and the second pair of wall surfaces 82B1 and 82B2 correspond to, for example, the mirror surfaces of the two micro-mirrors 65B1 and 65B2 in the first embodiment respectively. Thus, the micro-mirror 81 constructed as mentioned above functions as four micro-mirrors.

Likewise, four optical fiber securing grooves 84A1, 84A2, 84B1, and 84B2 are formed on the top surface of the thick single crystal silicon layer 61 along the longitudinal direction thereof by applying a dry etching to the thick single crystal silicon layer 61, two grooves 84A1 and 84A2 being formed in parallel with each other on the top surface of the thick single crystal silicon layer 61 at one side of the micro-mirror 81 and the remaining two grooves 84B1 and 84B2 being formed in parallel with each other on the top surface of the thick single crystal silicon layer 61 at the other side of the micro-mirror 81. The two optical fiber securing grooves 84A1 and 84A2 at one side and the two optical fiber securing grooves 84B1 and 84B2 at the other side are juxtaposed in parallel with each other respectively, and the two optical fiber securing grooves 84A1, 84B2 and the two optical fiber securing grooves 84A2, 84B1 opposed to each other through the micro-mirror 81 put therebetween in the longitudinal direction of the thick single crystal silicon layer 61 are aligned with one another.

Here, it is needless to say that the micro-mirror 81 is formed on the top surface of the movable plate-like electrode 67 at substantially the central portion thereof in such manner that the mirror surfaces 82A, 82A2 and 82B1, 82B2 thereof form an angle of 45° with the corresponding optical fiber securing grooves 84A1, 84B2 and 84A2, 84B1, respectively.

In case of forming the optical fiber securing grooves 84A1, 84A2 and 84B1, 84B2 by the dry etching, in general, each groove becomes a square or quadrilateral shape groove (a groove in which the bottom surface thereof forms a horizontal plane and both side walls thereof stand erect from the bottom surface) or U-shaped groove. For this reason, as shown in FIG. 11, a plurality of springs 85 are formed on one of the side walls of each of the optical fiber securing grooves 84A1, 84A2, 84B1, and 84B2 integrally therewith, and the optical fibers 31A, 32A, 31B, and 32B received respectively in the corresponding optical fiber securing grooves 84A1, 84A2, 84B1, and 84B2 are located and secured therein by the springs 85. Further, Deep-RIE (Reactive Ion Etching) technology can be used as the above dry etching.

A method of manufacturing the springs 85 will be described. In case of fabricating the optical fiber securing grooves 84A1, 84A2 and 84B1, 84B2 by dry etching, spring bodies integrally with the one side wall of a thick single crystal silicon of each optical fiber securing groove are formed at the same time by applying the dry etching to the thick single crystal silicon, and then, the silicon dioxide layer 62 (not seen in FIG. 11) that is the base of the spring bodies (to which all the bottom surfaces of the spring bodies are connected) is removed by, for example, a wet etching. Thus, a plurality of the elastic springs 85 integrally with the one side wall is formed.

As the silicon dioxide layer 62 that is the base of the spring bodies is etched, the silicon dioxide layer 62 that is the base of the micro-mirror 81 is also etched and removed only a little. Accordingly, it is preferred that the central portion of the micro-mirror 81 including the crossing is formed into a quadrangular or right prism-like pillar the area of section of which is larger, as shown in FIG. 11, so that the micro-mirror 81 is held in the state that it is strongly secured on the movable plate-like electrode 67 even the silicon dioxide layer 62 is removed only a little. Further, since the micro-mirror 81 may be one in which the area of section of the central portion including the crossing thereof is large to a certain degree, the central portion of the micro-mirror 81 is not limited to a quadrangular prism-like pillar, and may be formed into a polygonal prism-like pillar other than a quadrangular prism-like pillar, a cylindrical pillar, a ellipsoidal pillar or the like. Alternatively, instead of increasing the area of section of the central portion of the micro-mirror 81, the thickness of each wall of the micro-mirror 81 on which a mirror surface is formed, may be made thick only a little.

In the second embodiment, there has been formed on the movable plate-like electrode 67 one micro-mirror 81 the central portion of which is formed into a quadrangular prism-like pillar and that has a shape of a generally cross in plan, but four thin plate-like micro-mirrors may be formed on the movable plate-like electrode 67 as in the first embodiment by applying the dry etching to the thick single crystal silicon layer 61. In such case, it is preferred to make the wall thickness of each of the four micro-mirrors thick only a little.

Alternatively, two micro-mirrors of a generally right-angled triangle in plan may be formed on the movable plate-like electrode 67 in a manner that they are opposed to each other by applying the dry etching to the thick single crystal silicon layer 61, each micro-mirror using two wall surfaces thereof forming at right angles with each other as its mirror surfaces. In case of forming such two micro-mirrors of a generally right-angled triangle in the second embodiment shown in FIG. 11, the two micro-mirrors are formed in a manner that they are opposed to each other in the up-and-down or vertical direction in FIG. 11, and the two wall surfaces forming at right angles with each other of one micro-mirror of a generally right-angled triangle correspond to, for example, the mirror surfaces 82A1 and 82B2 in the second embodiment and the two wall surfaces forming at right angles with each other of the other micro-mirror of a generally right-angled triangle correspond to, for example, the mirror surfaces 82A2 and 82B1 in the second embodiment. In such case, each micro-mirror may be one that is provided with two wall surfaces forming at right angles with each other, and the shape of each micro-mirror is not limited to a generally right-angled triangle.

In this way, in case of using a dry etching, micro-mirrors of various shapes can be formed, and the shape of each micro-mirror is not limited to shapes mentioned above. In addition, it goes without saying that the optical fibers received in the corresponding optical fiber securing grooves may be secured therein by suitable fixing or securing means other than a spring.

Figure 12:
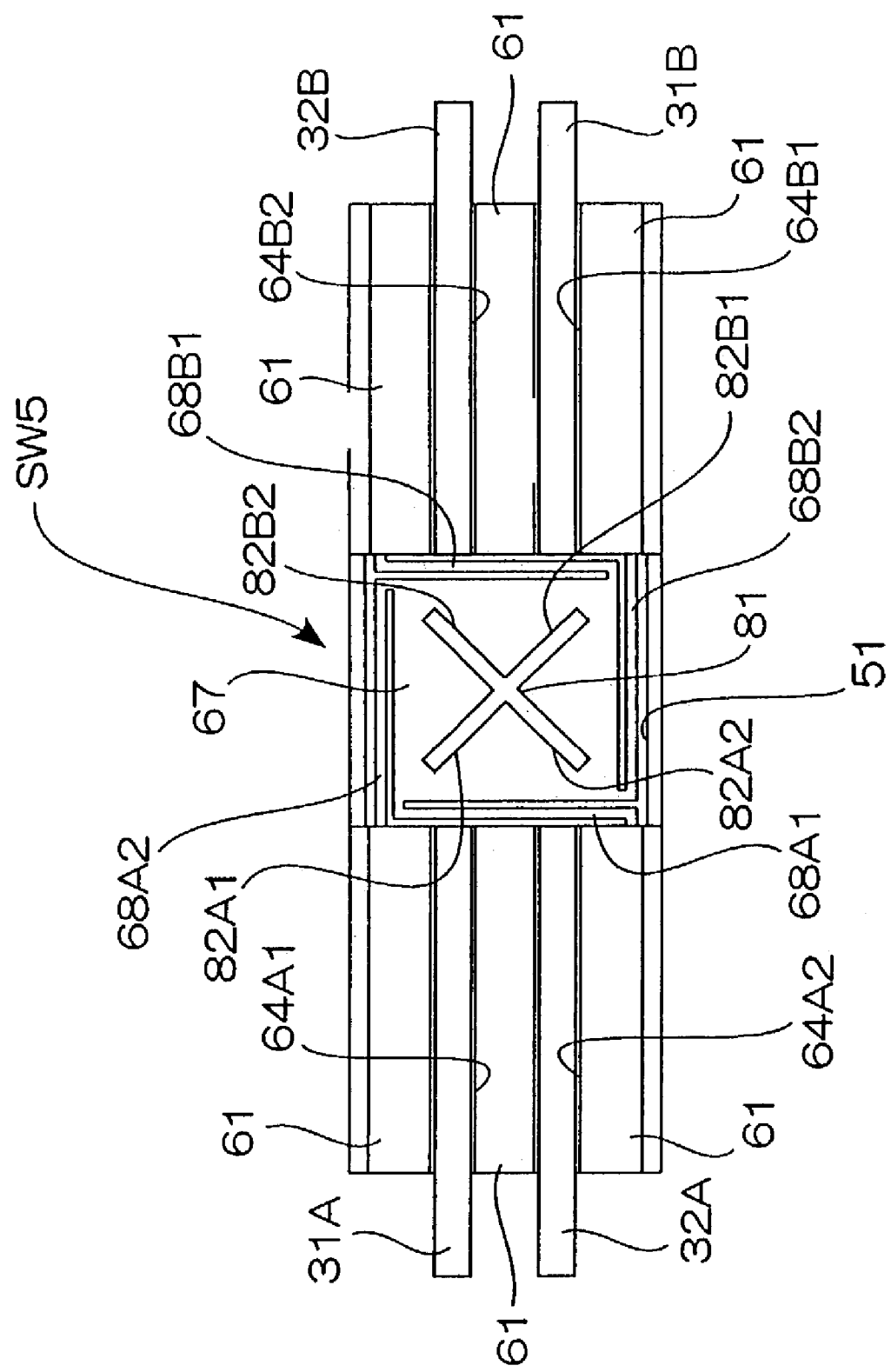
FIG. 12 is a plan view showing a third embodiment of the optical switch according to the present invention.

FIG. 12 is a plan view showing a third embodiment of the optical switch according to the present invention. The optical switch SW5 of the third embodiment is a 2×2 optical switch having the same construction and structure as those of the optical switch SW3 of the first embodiment already discussed with reference to FIGS. 4 to 6 and those of the optical switch SW4 of the second embodiment already discussed with reference to FIG. 11 except that as to a micro-mirror, one micro-mirror 81 that has a shape of a generally cross in plan is formed by applying the dry etching to the thick single crystal silicon layer 61 as in the second embodiment, and that as to optical fiber securing grooves, grooves 64A1, 64A2, 64B1, 64B2 of a generally V-shape in section are formed by applying the chemical anisotropic wet etching to the thick single crystal silicon layer 61 as in the first embodiment. Accordingly, in FIG. 12, portions and elements corresponding to those shown in FIGS. 4 to 6 and FIG. 11 will be denoted by the same reference characters attached thereto, and explanation thereof will be omitted unless necessary. In this third embodiment, it is preferred that the grooves 64A1, 64A2, 64B1, 64B2 of a generally V-shape in section are, at first, formed by applying the chemical anisotropic wet etching to the thick single crystal silicon layer 61 and thereafter, the one micro-mirror 81 having a shape of a generally cross in plan is formed by applying the dry etching to the thick single crystal silicon layer 61.

Since it is apparent that in the optical switch SW4 of the second embodiment constructed as discussed above and the optical switch SW5 of the third embodiment constructed as discussed above, the same function and effects as those of the optical switch SW3 of the first embodiment can be also obtained therefrom, explanation thereof will be omitted.

As is clear from the foregoing, in accordance with the present invention, by selecting the thickness of the spacer that is easy in manufacture, the electrode-to-electrode distance (gap) between the movable plate-like electrode and the fixed electrode can be easily set to a desired distance. Consequently, there is obtained an advantage that it is easy to set the electrode-to-electrode distance to a necessary and minimum distance. In addition, since there is no need to provide an elevated portion on the fixed electrode substrate unlike the prior art optical switches, the surface of the fixed electrode substrate on which the fixed electrode is to be formed is flat. Therefore, there is also obtained an advantage that protrusions, an electrode pattern for preventing the sticking from occurring or the like can easily be formed on the surface of the fixed electrode substrate with high accuracy.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. An optical switch manufactured by use of micromachining technology comprising:
   a first substrate that comprises: a fixed electrode substrate that has a flat surface; and a fixed electrode formed on said flat surface of said fixed electrode substrate;
   a spacer on said flat surface of the fixed electrode substrate, said spacer having a through hole exposing said fixed electrode;
   a second substrate that comprises: a thin single crystal silicon layer on said spacer substantially in parallel with the fixed electrode and with a gap therebetween; an insulation layer on said thinner single crystal silicon layer; and a thick single crystal silicon layer on said insulation layer, said thick single crystal silicon layer being thicker than the thin single crystal silicon layer;
   a movable plate-like electrode formed in the thin single crystal silicon layer of the second substrate;
   a plurality of flexible beam-like members supporting the removable plate-like electrode to be movable toward and away from the fixed electrode, said flexible beam-like members formed in the thin single crystal silicon layer of the second substrate integrally with the movable plate-like electrode;
   a plurality of optical fiber securing grooves formed on the thick single crystal silicon layer of the second substrate; and
   a plurality of micro-mirrors that are located within an opening of the thick single crystal silicon layer of the second substrate, said opening positioned above the movable plate-like electrode, said micro-mirrors standing erect from the top surface of the movable plate-like electrode through the insulation layer of the second substrate that exists between the top surface of the movable plate-like electrode and the micro-mirrors being-located on extensions of the optical fiber securing grooves; and
   wherein the optical switch is constructed such that an optical path for an optical beam incident thereon is changed by electrostatically driving the movable plate-like electrode toward the fixed electrode thereby to displace the micro-mirrors.

2. The optical switch as set forth in claim 1, wherein a plurality of minute protrusions that protrude from the top surface of the fixed electrode formed on the flat surface of the fixed electrode substrate are provided on the flat surface of the fixed electrode substrate.

3. The optical switch as set forth in claim 1 or 2, wherein the second substrate is an SOI substrate of three layer structure that comprises a thick single crystal silicon layer, a silicon oxide layer formed on the bottom surface of said thick single crystal silicon layer, and a thin single crystal silicon layer joined to the bottom surface of said silicon oxide layer.

4. The optical switch as set forth in claim 1 or 2, wherein a plurality of the micro-mirrors is four each of which has a thin plate-like shape and one mirror surface, the four microminors standing erect in such manner that the mirror surfaces of the micro-mirrors are at an angle of 45° with the corresponding optical fiber securing grooves and that adjacent two mirror surfaces are at right angles with each other, and
   wherein a plurality or the optical fiber securing grooves is four, and the four optical fiber securing grooves are formed on the thick single crystal silicon layer such that two grooves are substantially in parallel with each other at one side of the micro-mirrors and the remaining two grooves are substantially in parallel with each other at the other side of the micro-mirrors in the longitudinal direction of the thick single crystal silicon layer, the two grooves at the one side and the two grooves at the other side aligned with one another, and the groove surface of each optical fiber securing groove having a generally V-shape.

5. The optical switch as set forth in claim 4, wherein:
   the movable plate-like electrode is farmed by applying an etching to the thin single crystal silicon layer;
   the plurality of flexible beam-like members are formed by applying an etching to the thin single crystal silicon layer;
   the opening of the thick single crystal silicon layer is formed concurrently with the plurality of micro-mirrors by applying an etching to the thick single crystal silicon layer; and
   the plurality of optical fiber securing grooves are formed applying an etching to the thick single crystal silicon layer.

6. The optical switch as set forth in claim 1 or 2, wherein a plurality of the micro-mirrors is two each of which has two wall surfaces that are at right angles with each other and are used as mirror surfaces respectively, the two micro-mirrors standing erect in such manner that the mirror surfaces of each micro-mirror are at an angle of 45° with die corresponding optical fiber securing grooves and that opposed mirror surfaces of the two micro-mirrors are at right angles with each other, and wherein a plurality of the optical fiber securing grooves is four, and the four optical fiber securing grooves are formed on the thick single crystal silicon layer such that two grooves are substantially in parallel with each other at one side of the micro-mirrors and the remaining two grooves are substantially in parallel with each other at the other side of the micro-mirrors in the longitudinal direction of the thick single crystal silicon layer, the two grooves at the one side and the two grooves at the other side aligned with one another, and the groove surface of each optical fiber securing groove having a generally square shape.

7. The optical switch as set forth in claim 6, wherein:

the movable plate-like electrode is formed by applying an etching to the thin single crystal silicon layer;

the plurality of flexible beam-like members are formed by applying an etching to the thin single crystal silicon layer;

the opening of the thick single crystal silicon layer is formed concurrently with the plurality of micro-mirrors by applying an etching to the thick single crystal silicon layer; and the plurality of optical fiber securing grooves are formed by applying an etching to the thick single crystal silicon layer.

8. An optical switch manufactured by use of micromachining technology comprising:

a first substrate that comprises: a fixed electrode substrate that has a flat surface; and a fixed electrode formed on said flat surface of said fixed electrode substrate;

a spacer on said flat surface of the fixed electrode substrate, said spacer having a through hole exposing said fixed electrode;

a second substrate that comprises: a thin single crystal silicon layer on said spacer substantially in parallel with the fixed electrode and with a gap therebetween; an insulation layer on said thinner single crystal silicon layer; and a thick single crystal silicon layer on said insulation layer, said thick single crystal silicon layer being thicker than the thin single crystal silicon layer;

a movable plate-like electrode formed in the thin single crystal silicon layer of the second substrate;

a plurality of flexible beam-like members supporting the movable plate-like electrode to be movable toward and away from the fixed electrode, said flexible beam-like members formed in the thin single crystal silicon layer of the second substrate integrally with the movable plate-like electrode;

a plurality of optical fiber securing grooves formed on the thick single crystal silicon layer of the second substrate; and a micro-mirror having a plurality of mirror surfaces that is located within an opening of the thick single crystal silicon layer of the second substrate, said opening positioned above the movable plate-like electrode, said micro-mirror standing erect from the top surface of the movable plate-like electrode through the insulation layer of the second substrate that exists between the top surface of the movable plate-like electrode and the micro-mirror, and the mirror surfaces located on the extensions of the optical fiber securing grooves; and wherein the optical switch is constructed such that an optical path for an optical beam incident thereon is changed by electrostatically driving the movable plate-like electrode toward the fixed electrode thereby to displace the micro mirror.

9. The optical switch as set forth in claim 8, wherein a plurality of minute protrusions tat protrude from the top surface of the fixed electrode formed on the flat surface of the fixed electrode substrate are provided on the flat surface of the fixed electrode substrate.

10. The optical switch as set forth in claim 8 or 9, wherein the second substrate is an SOI substrate of three layer structure that comprises a thick single crystal silicon layer, a silicon oxide layer formed on the bottom surface of said thick single crystal silicon layer, and a thin single crystal silicon layer joined to the bottom surface of said silicon oxide layer.

11. The optical switch as set forth in claim 8 or 9, wherein the micro-mirror has a generally cross shape in plan, and a first pair of mirror surfaces of the generally cross-shaped micro-mirror are at right angles with each other as well as a second pair of mirror surfaces of the generally cross-shaped micro-mirror are at right angles with each other and opposed to the first pair of mirror surfaces, the mirror surfaces at angle of 45° with corresponding optical fiber securing grooves, and wherein a plurality of the optical fiber securing grooves is four, and the four optical fiber securing grooves are formed on the tick single crystal silicon layer such that two grooves are substantially in parallel with each other at one side of the micro-mirror and the remaining two grooves are substantially in parallel with each other at the other side of the micro-mirror in the longitudinal direction of the thick single crystal silicon layer, the two grooves at the one side and the two grooves at the other side aligned with one another, and the groove surface of each optical fiber securing groove having a generally square shape.

12. The optical switch as set forth in claim 11, wherein:

the movable plate-like electrode is formed by applying an etching to the thin single crystal silicon layer;

the plurality of flexible beam-like members are formed by applying an etching to the thin single crystal silicon layer;

the opening of the thick single crystal silicon layer is formed concurrently with the micro-mirror by applying an etching to the thick single crystal silicon layer; and the plurality of optical fiber securing grooves are formed by applying an etching to the thick single crystal silicon layer.

13. The optical switch as set forth in claim 11, wherein the micro-mirror having a generally cross shape in plan is one having a modified cross shape in plan in which the central portion thereof including the crossing is formed into a pillar the area of section of which is larger.

14. The optical switch as set forth in claim 12, wherein the micro-mirror having a generally cross shape in plan is one having a modified cross shape in plan in which the central portion thereof including the crossing is formed into a pillar the area of section of which is larger.

* * * * *